(12) United States Patent
Murakami

(10) Patent No.: US 9,111,963 B2
(45) Date of Patent: Aug. 18, 2015

(54) METHOD FOR MANUFACTURING SEMICONDUCTOR MEMORY DEVICE AND SEMICONDUCTOR MEMORY DEVICE

(71) Applicant: Kabushiki Kaisha Toshiba, Minato-ku (JP)

(72) Inventor: Sadatoshi Murakami, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 44 days.

(21) Appl. No.: 13/971,139

(22) Filed: Aug. 20, 2013

(65) Prior Publication Data

US 2014/0284686 A1    Sep. 25, 2014

(30) Foreign Application Priority Data

Mar. 25, 2013    (JP) .................................. 2013-063091

(51) Int. Cl.
*H01L 29/792* (2006.01)
*H01L 29/66* (2006.01)
*H01L 27/115* (2006.01)

(52) U.S. Cl.
CPC ...... *H01L 29/66833* (2013.01); *H01L 27/1157* (2013.01); *H01L 27/11582* (2013.01); *H01L 29/7926* (2013.01)

(58) Field of Classification Search
CPC ....................... H01L 27/11582; H01L 29/7926
USPC .......................................... 257/324, 325, 328
See application file for complete search history.

(56) References Cited

U.S. PATENT DOCUMENTS

| | | | |
|---|---|---|---|
| 6,979,859 B2 | 12/2005 | Hofmann et al. | |
| 8,017,993 B2 * | 9/2011 | Kidoh et al. | 257/324 |
| 8,372,720 B2 * | 2/2013 | Fukuzumi et al. | 438/287 |
| 8,476,696 B2 * | 7/2013 | Komiya | 257/325 |
| 8,669,608 B2 * | 3/2014 | Sato et al. | 257/324 |
| 8,710,581 B2 * | 4/2014 | Komiya | 257/325 |

(Continued)

FOREIGN PATENT DOCUMENTS

| | | | |
|---|---|---|---|
| JP | 2877462 B2 | 3/1992 | |
| JP | 7-235649 A | 9/1995 | |

(Continued)

OTHER PUBLICATIONS

Office Action issued May 19, 2015 in Japanese Patent Application No. 2013-063091 (with English translation).

*Primary Examiner* — Earl Taylor
(74) *Attorney, Agent, or Firm* — Oblon, McClelland, Maier & Neustadt, L.L.P.

(57) ABSTRACT

According to one embodiment, a method for manufacturing a semiconductor memory device includes forming a plurality of pillars and a plurality of sidewall films on a stacked body including a plurality of electrode layers stacked alternately with a plurality of insulating layers. The pillars are arranged in a first direction and a second direction intersecting the first direction at different pitches in the first direction and the second direction. The sidewall films are provided on outer circumferential surfaces of the pillars to extend in the first direction to be linked in the first direction and separated in the second direction. The method includes making a slit to divide the stacked body in the second direction by etching the stacked body under a region between the sidewall films adjacent to each other in the second direction using the pillars and the sidewall films as a mask.

8 Claims, 25 Drawing Sheets

(56) References Cited

U.S. PATENT DOCUMENTS

| | | | |
|---|---|---|---|
| 8,735,965 B2* | 5/2014 | Ishihara et al. | 257/324 |
| 8,749,078 B2* | 6/2014 | Murakami | 257/797 |
| 8,772,859 B2* | 7/2014 | Higuchi | 257/324 |
| 8,847,303 B2* | 9/2014 | Kito et al. | 257/324 |
| 8,907,402 B2* | 12/2014 | Shinohara | 257/326 |
| 2010/0207195 A1* | 8/2010 | Fukuzumi et al. | 257/326 |
| 2010/0213527 A1* | 8/2010 | Shim et al. | 257/314 |
| 2010/0244119 A1* | 9/2010 | Fukuzumi et al. | 257/324 |
| 2011/0084331 A1* | 4/2011 | Tanaka et al. | 257/324 |
| 2012/0168824 A1* | 7/2012 | Lee | 257/204 |
| 2013/0126961 A1* | 5/2013 | Fukuzumi et al. | 257/324 |
| 2013/0234299 A1* | 9/2013 | Murakami | 257/632 |
| 2014/0061754 A1* | 3/2014 | Murakami | 257/315 |
| 2014/0284686 A1* | 9/2014 | Murakami | 257/324 |
| 2014/0284687 A1* | 9/2014 | Murakami | 257/324 |

FOREIGN PATENT DOCUMENTS

| | | |
|---|---|---|
| JP | 2005-530336 A | 10/2005 |
| JP | 3963678 | 6/2007 |
| JP | 2009-146954 A | 7/2009 |
| JP | 2012-256932 | 12/2012 |
| WO | WO 2009/075370 A1 | 6/2009 |

* cited by examiner

METHOD FOR MANUFACTURING SEMICONDUCTOR MEMORY DEVICE AND SEMICONDUCTOR MEMORY DEVICE

CROSS-REFERENCE TO RELATED APPLICATION

This application is based upon and claims the benefit of priority from Japanese Patent Application No. 2013-063091, filed on Mar. 25, 2013; the entire contents of which are incorporated herein by reference.

FIELD

Embodiments described herein relate generally to a method for manufacturing a semiconductor memory device and a semiconductor memory device.

BACKGROUND

A memory device having a three-dimensional structure has been proposed in which memory holes are made in a stacked body in which insulating layers are multiply stacked alternately with electrode layers that function as control gates of memory cells, and silicon bodies used to form channels are provided on the side walls of the memory holes with a charge storage film interposed between the silicon bodies and the side walls.

As the density of the memory holes is increased to increase the bit count per unit surface area, the requirements of the alignment precision between the memory holes and the slits that divide the electrode layers into pluralities are becoming even more stringent; and there is a fear of formation defects of the memory holes.

Although a method may be considered to simply make the memory holes and the slits simultaneously by lithography, the technical degree of difficulty is high; and in the current state of the art, it is difficult to ensure process margins.

DETAILED DESCRIPTION

Figure 1:
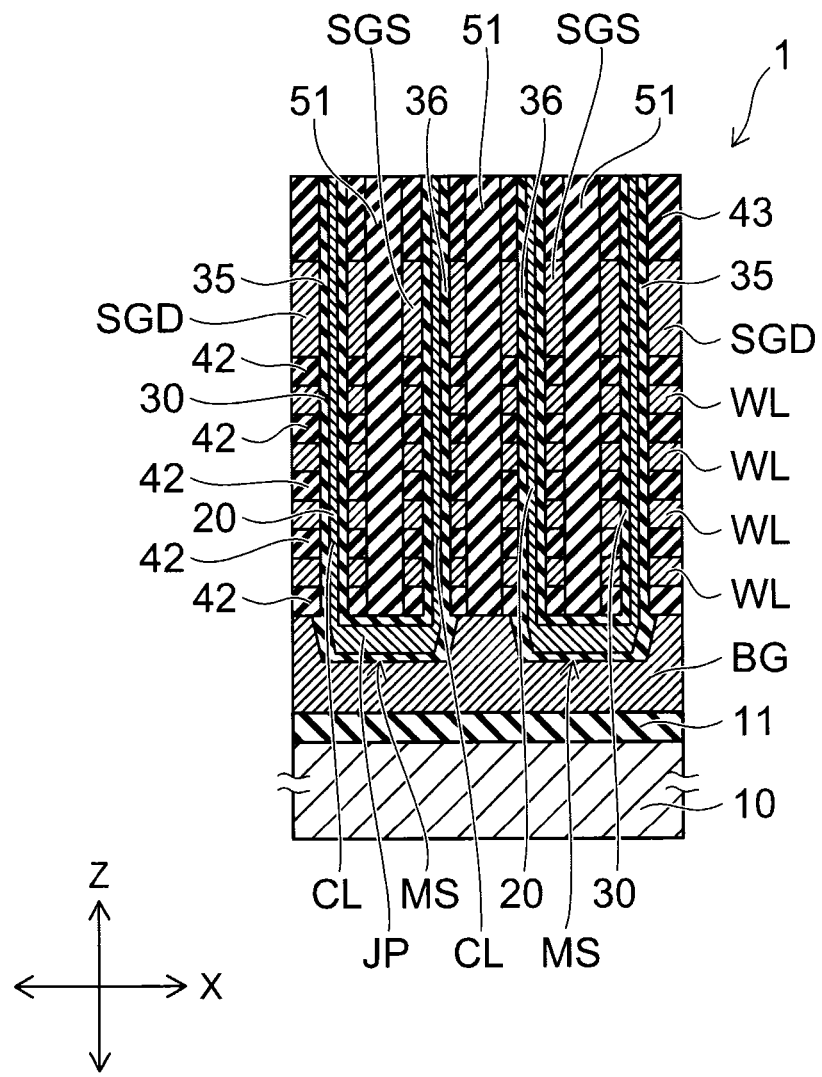
FIG. 1 is a schematic cross-sectional view of a semiconductor memory device of an embodiment.

According to one embodiment, a method for manufacturing a semiconductor memory device includes forming a plurality of pillars and a plurality of sidewall films on a stacked body including a plurality of electrode layers stacked alternately with a plurality of insulating layers. The plurality of pillars is arranged in a first direction and a second direction intersecting the first direction at different pitches in the first direction and the second direction. The plurality of sidewall films is provided on outer circumferential surfaces of the pillars to extend in the first direction to be linked in the first direction and separated in the second direction. The method includes making a slit to divide the stacked body in the second direction by etching the stacked body under a region between the sidewall films adjacent to each other in the second direction using the pillars and the sidewall films as a mask.

Embodiments will now be described with reference to the drawings. Similar components in the drawings are marked with like reference numerals.

FIG. 1 is a schematic cross-sectional view of a memory cell array 1 of a semiconductor memory device of an embodiment.

Figure 2:
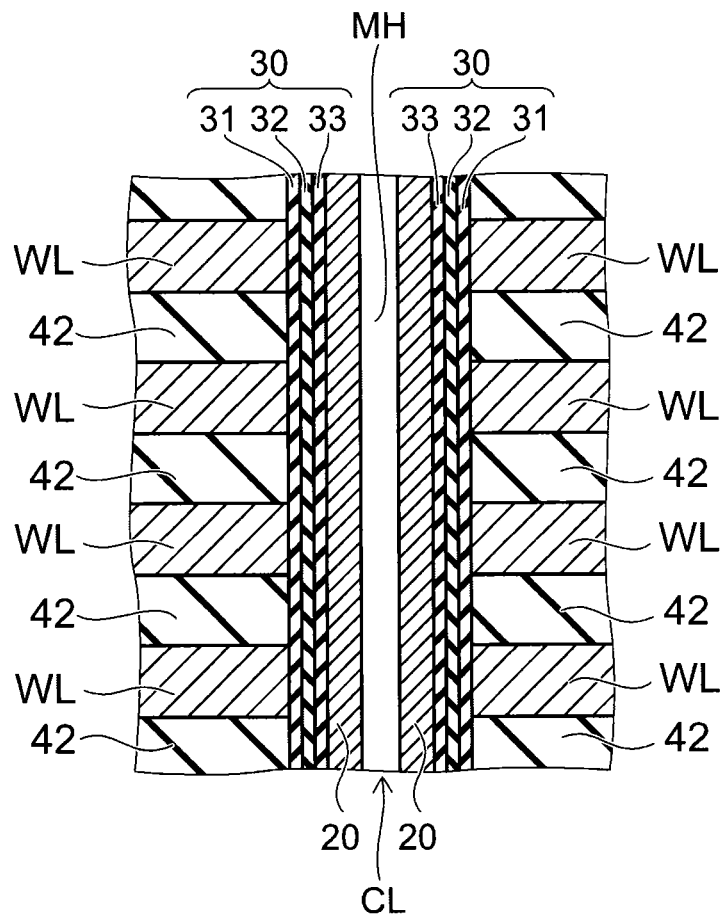
FIG. 2 is an enlarged schematic cross-sectional view of memory cells of FIG. 1.

FIG. 2 is an enlarged schematic cross-sectional view of the memory cells of FIG. 1.

The memory cell array 1 of the embodiment includes a stacked body in which an electrode layer WL and an insulating layer 42 are multiply stacked alternately one layer at a time. The stacked body is provided on a back gate BG. The number of layers of the electrode layers WL shown in the drawing is an example; and the number of layers of the electrode layers WL is arbitrary.

The back gate BG is provided on a substrate 10 with an insulating layer 11 interposed. The electrode layers WL and the back gate BG are conductive layers, e.g., silicon layers into which an impurity is added.

Two mutually orthogonal directions parallel to a major surface of the substrate 10 are taken as an X direction (a second direction) and a Y direction (a first direction). The Y direction is a direction piercing the page surface in FIG. 1.

A direction orthogonal to the X direction and the Y direction is taken as a Z direction (the stacking direction of the stacked body or a third direction). The cross section shown in FIG. 1 is parallel to the XZ plane.

The memory cell array 1 includes multiple memory strings MS. One memory string MS is formed in a U-shaped configuration to include a pair of columnar portions or pillars CL extending in the Z direction and a linking portion JP that links the lower ends of the pair of pillars CL.

A drain-side selection gate SGD is provided at one upper end portion of the pair of pillars CL of the memory string MS having the U-shaped configuration; and a source-side selection gate SGS is provided at the other upper end portion. The drain-side selection gate SGD and the source-side selection gate SGS (hereinbelow, also collectively called the selection gates SG) are provided on the electrode layer WL of the uppermost layer with the insulating layer 42 interposed between the drain-side selection gate SGD and the electrode layer WL of the uppermost layer and between the source-side selection gate SGS and the electrode layer WL of the uppermost layer.

The drain-side selection gate SGD and the source-side selection gate SGS are silicon layers into which an impurity is added.

The drain-side selection gate SGD and the source-side selection gate SGS are separated in the X direction by an insulating separation film 51. The stacked body including the electrode layers WL that are stacked under the drain-side selection gate SGD and the stacked body including the electrode layers WL that are stacked under the source-side selection gate SGS are partitioned in the X direction by the insulating separation film 51. In other words, the stacked body between the pair of pillars CL of the memory string MS is divided in the X direction by the insulating separation film 51.

Also, the stacked body between the memory strings MS that are adjacent to each other in the X direction is divided in the X direction by the insulating separation film 51.

A not-shown source line (a metal film) is provided on the source-side selection gate SGS with an insulating layer 43 interposed. A not-shown bit line (a metal film) is provided on the drain-side selection gate SGD with the insulating layer 43 interposed. Each of the bit lines extends in the X direction.

The memory string MS includes a channel body 20 provided inside a memory hole MH (shown in FIG. 4B) made in a U-shaped configuration in the stacked body that includes the back gate BG, the multiple electrode layers WL, the drain-side selection gate SGD, and the source-side selection gate SGS. The channel body 20 is, for example, a non-doped silicon film.

The channel body 20 is provided inside the memory hole MH having the U-shaped configuration with a memory film 30 interposed. As shown in FIG. 2, the memory film 30 is provided between the channel body 20 and the inner wall of the memory hole MH. The memory film 30 is provided in a cylindrical configuration around the outer circumferential surface of the channel body 20.

Although a structure in which the channel body 20 is provided such that a hollow portion remains at the central axis of the memory hole MH is shown in FIG. 2, a structure may be used in which the channel body 20 completely fills the interior of the memory hole MH or an insulating film is filled into the hollow portion inside the channel body 20.

The memory film 30 includes a blocking film 31, a charge storage film 32, and a tunneling film 33. The blocking film 31, the charge storage film 32, and the tunneling film 33 are provided in order from the electrode layer WL side between the channel body 20 and each of the electrode layers WL. The blocking film 31 contacts each of the electrode layers WL; the tunneling film 33 contacts the channel body 20; and the charge storage film 32 is provided between the blocking film 31 and the tunneling film 33.

The channel body 20 functions as a channel of the memory cells; the electrode layers WL function as control gates of the memory cells; and the charge storage film 32 functions as a data storage layer that stores the charge injected from the channel body 20. In other words, the memory cells are formed at the intersections between the channel body 20 and each of the electrode layers WL and have a structure in which the control gate is provided around the channel.

The semiconductor memory device of the embodiment is a nonvolatile semiconductor memory device that can freely and electrically erase/program data and retain the memory content even when the power supply is OFF.

The memory cell is, for example, a charge trap memory cell. The charge storage film 32 has many trap sites that trap the charge and is, for example, a silicon nitride film.

The tunneling film 33 is, for example, a silicon oxide film and is used as a potential barrier when the charge is injected from the channel body 20 into the charge storage film 32 or when the charge stored in the charge storage film 32 diffuses into the channel body 20.

The blocking film 31 is, for example, a silicon oxide film and prevents the charge stored in the charge storage film 32 from diffusing into the electrode layer WL.

As shown in FIG. 1, a gate insulating film 35 is provided between the drain-side selection gate SGD and the channel body 20. The drain-side selection gate SGD, the channel body 20, and the gate insulating film 35 are included in a drain-side selection transistor. The channel body of the drain-side selection transistor is connected to the bit line above the drain-side selection gate SGD.

A gate insulating film 36 is provided between the source-side selection gate SGS and the channel body 20. The source-side selection gate SGS, the channel body 20, and the gate insulating film 36 are included in a source-side selection transistor. The channel body of the source-side selection transistor is connected to the source line above the source-side selection gate SGS.

The back gate BG, the channel body 20 provided inside the back gate BG, and the memory film 30 provided inside the back gate BG are included in a back gate transistor.

The memory cells having the electrode layers WL of each layer as control gates are multiply provided between the drain-side selection transistor and the back gate transistor. Similarly, the memory cells having the electrode layers WL of each layer as control gates are multiply provided between the back gate transistor and the source-side selection transistor.

The multiple memory cells, the drain-side selection transistor, the back gate transistor, and the source-side selection transistor are connected in series via the channel body 20 and are included in one memory string MS having a U-shaped configuration. By the memory string MS being multiply arranged in the X direction and the Y direction, the multiple memory cells are provided three-dimensionally in the X direction, the Y direction, and the Z direction.

The insulating separation film 51 extends through the stacked body that includes the electrode layers WL of the multiple layers, the drain-side selection gate SGD, and the source-side selection gate SGS in the stacking direction (the Z direction) of the stacked body to divide the stacked body in the X direction. The insulating separation film 51 extends in the Y direction (the direction piercing the page surface in FIG. 1).

Figure 22A:
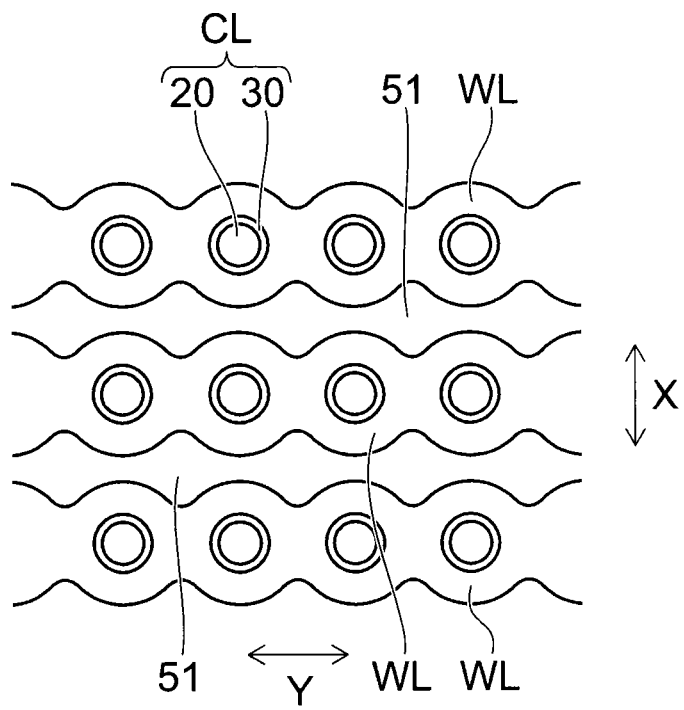
FIG. 22A to FIG. 23B are schematic plan views of the semiconductor memory device of the embodiment.

FIG. 22A is a schematic view showing an example of a planar layout of the electrode layer WL and the insulating separation film 51.

The electrode layer WL is divided into a plurality in the X direction by the insulating separation film 51 that extends in the Y direction. Each of the electrode layers WL extends in the Y direction.

The side wall of the insulating separation film 51 is formed not in a linear configuration along the Y direction but in a configuration having an unevenness that repeats in a wave-like configuration along the Y direction. The width (the width in the X direction) of the insulating separation film 51 is nonuniform and has a relatively large portion and a relatively small portion. The portion of the insulating separation film 51 having the relatively large width is repeated periodically in the Y direction alternately with the portion of the insulating separation film 51 having the relatively small width.

The side wall of the electrode layer WL contacting the insulating separation film 51 also is formed in a configuration having an unevenness that repeats in a wave-like configuration along the Y direction.

At the portion of the insulating separation film 51 having the relatively small width, the protrusions of the side walls of the mutually-adjacent electrode layers WL oppose each other in the X direction with the insulating separation film 51 interposed. At the portion of the insulating separation film 51 having the relatively large width, the recesses of the side walls of the mutually-adjacent electrode layers WL oppose each other in the X direction with the insulating separation film 51 interposed.

The portion of the electrode layer WL having the relatively large width (the width in the X direction) is repeated periodically in the Y direction alternately with the portion of the electrode layer WL having the relatively small width. The pillar CL made of the stacked film of the channel body 20 and the memory film 30 is disposed at the portion of the electrode layer WL having the relatively large width.

The multiple pillars CL are arranged at different pitches in the X direction and the Y direction. The multiple pillars CL are arranged in the Y direction at a first pitch. The multiple pillars CL are arranged in the X direction at a second pitch. The second pitch is larger than the first pitch. In other words, the distance between the pillars CL that are adjacent to each other in the X direction is greater than the distance between the pillars CL that are adjacent to each other in the Y direction.

A method for forming the memory cell array 1 will now be described.

Figure 3A:
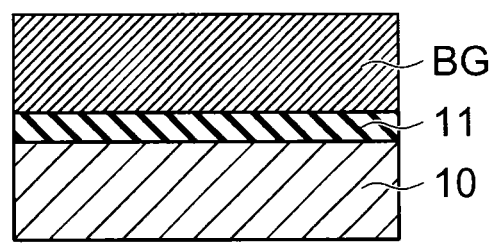
FIG. 3A to FIG. 4B are schematic cross-sectional views showing a method for manufacturing the semiconductor memory device of the embodiment.

As shown in FIG. 3A, the back gate BG is formed on the substrate 10 with the insulating layer 11 interposed. The back gate BG is, for example, a polycrystalline silicon film to which, for example, boron is added as an impurity. The substrate 10 and the insulating layer 11 are not shown in FIG. 3B and subsequent drawings.

Figure 3B:
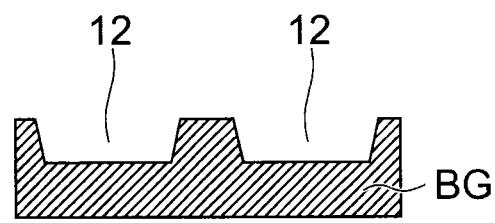

As shown in FIG. 3B, a recess 12 is made in the back gate BG by etching using a not-shown mask.

Figure 3C:
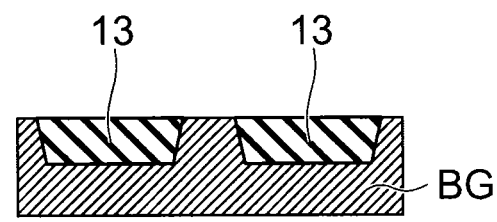

As shown in FIG. 3C, a sacrificial film 13 is filled into the recess 12. The sacrificial film 13 is, for example, a silicon nitride film.

Figure 3D:
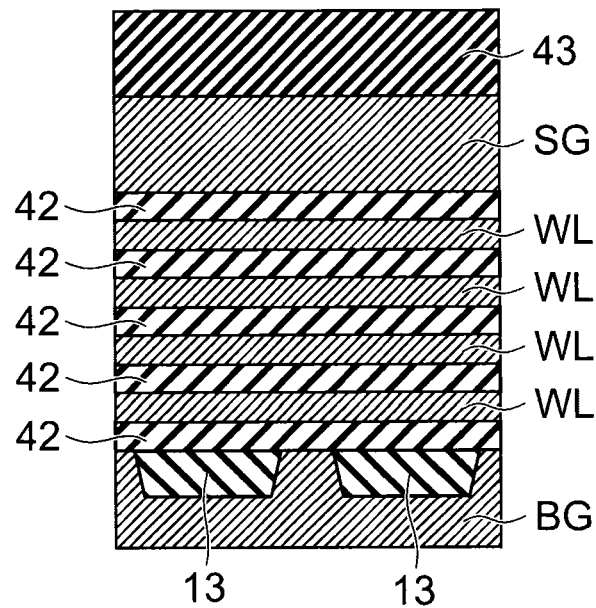

As shown in FIG. 3D, the insulating layers 42 and the electrode layers WL are multiply stacked alternately on the sacrificial film 13 and on the back gate BG. Further, the selection gate SG is stacked on the insulating layer 42 of the uppermost layer; and the insulating layer 43 is stacked on the selection gate SG.

The electrode layer WL and the selection gate SG are polycrystalline silicon films to which, for example, boron is added as an impurity. The insulating layer 42 is, for example, a silicon oxide film.

Subsequently, the memory holes and the slit that divides the stacked body into a plurality are made.

Here, the case where the memory holes and the slit are patterned by separate lithography processes is considered as a comparative example. In the lithography processes, normally, the precision of the exposure position with respect to the foundation fluctuates in the wafer surface because the exposure is repeatedly performed in the wafer surface several tens to several hundreds of times. Therefore, there is a risk that the alignment precision of the memory holes and the slit may be lower and formation defects (deformation and disappearance) of the memory holes may occur according to the position in the wafer surface.

Even in the case where the exposure position, the magnification, etc., are corrected each time the exposure is performed, the apparatus capabilities in the current state of the art cannot keep up with the precision requirements that are becoming more stringent.

Further, although a method for making the memory holes and the slit by collectively exposing may be considered, generally, it is difficult to simultaneously make a line-type slit pattern and a hole-type pattern by lithography using mass production technology.

Therefore, according to the embodiment described below, the slit pattern can be made self-aligningly with respect to the memory hole pattern by forming a sidewall film on pillars that correspond to the memory hole pattern and using the sidewall film as a mask to pattern the stacked body.

First Embodiment

FIG. 5A to FIG. 12B are schematic views showing a method for making the memory holes and the slit according to a first embodiment.

Figure 5A:
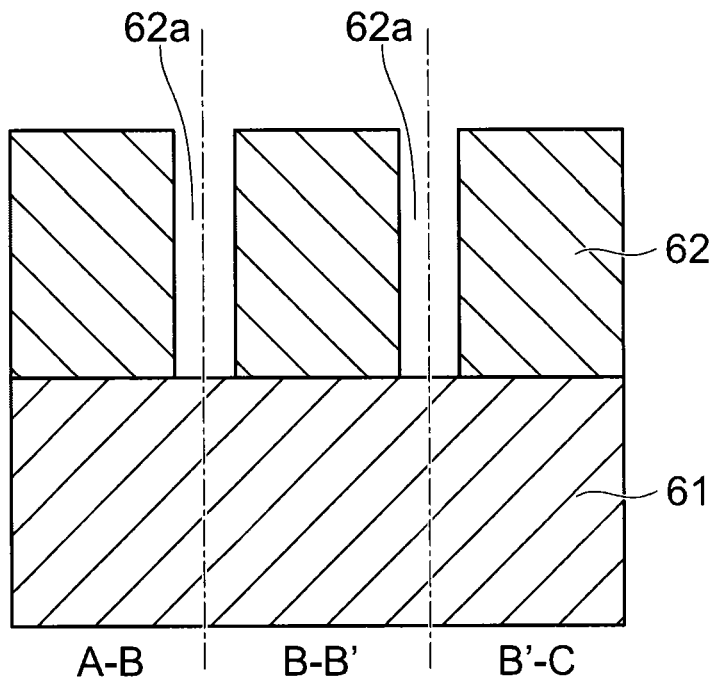
FIG. 5A to FIG. 12B are schematic views showing a method for manufacturing a semiconductor memory device of a first embodiment.
Figure 5B:
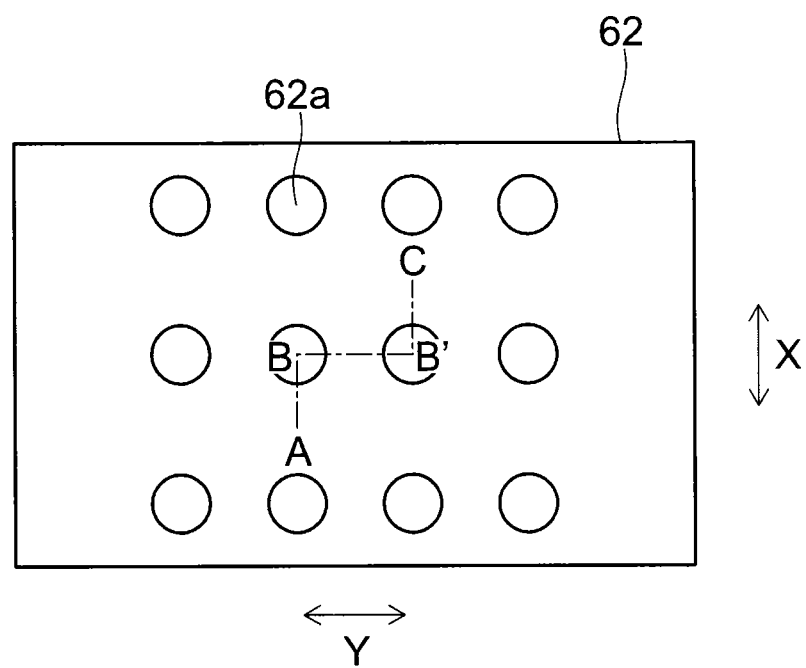

FIG. 5B is a top view of FIG. 5A; and FIG. 5A shows the A-B cross section, the B-B' cross section, and the B'-C cross section of FIG. 5B.

A sacrificial film (a hard mask) 61 is formed on the stacked body shown in FIG. 3D; and a mask layer 62 including, for example, a resist film is formed on the sacrificial film 61. The sacrificial film 61 is, for example, a carbon-based film.

Multiple holes 62a are made in the mask layer 62 by a lithography process. The multiple holes 62a are arranged at different pitches in the X direction and the Y direction. The multiple holes 62a are arranged in the Y direction at the first pitch. The multiple holes 62a are arranged in the X direction at the second pitch. The second pitch is larger than the first pitch. In other words, the distance between the holes 62a that are adjacent to each other in the X direction is greater than the distance between the holes 62a that are adjacent to each other in the Y direction.

Figure 6A:
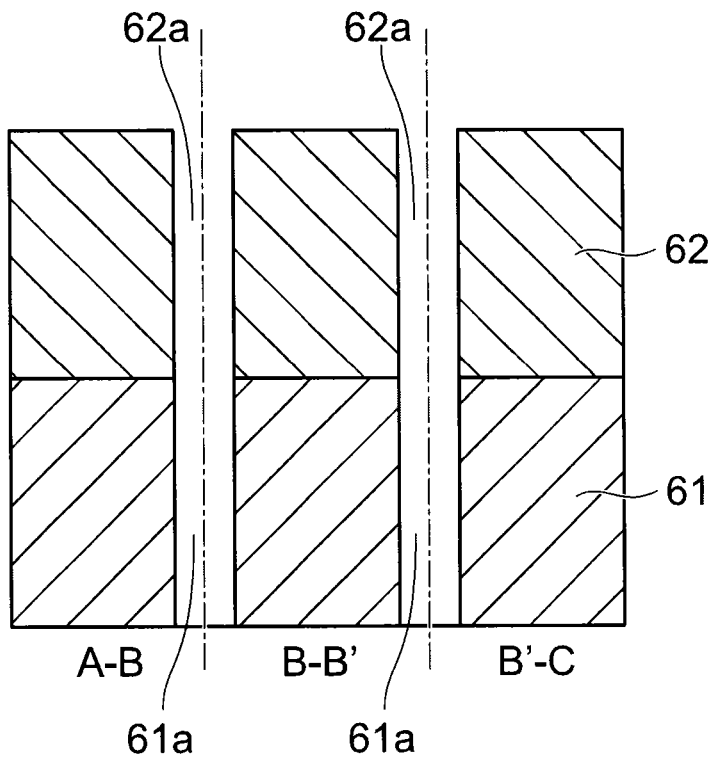
Figure 6B:
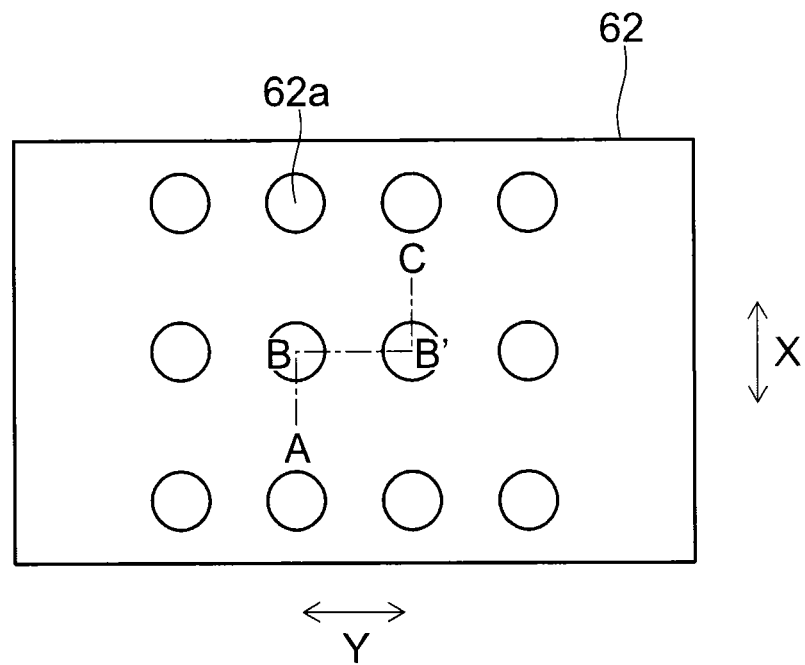

Multiple holes 61a are made in the sacrificial film 61 as shown in FIGS. 6A and 6B by etching using a mask that is made of the mask layer 62 in which the holes 62a are made. The holes 61a are made under the holes 62a of the mask layer 62.

FIG. 6B is a top view of FIG. 6A; and FIG. 6A shows the A-B cross section, the B-B' cross section, and the B'-C cross section of FIG. 6B.

Figure 7A:
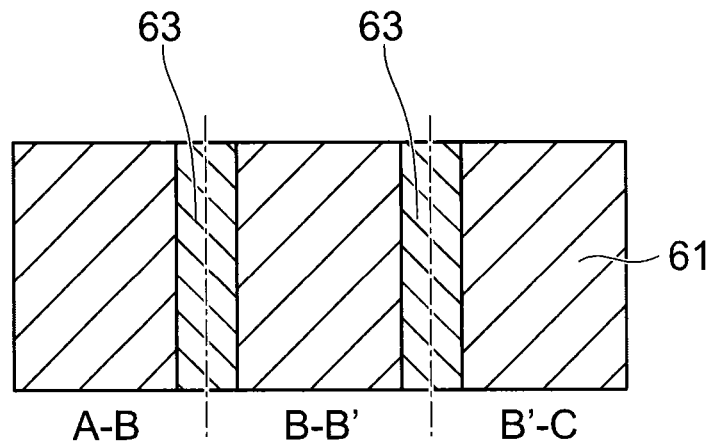
Figure 7B:
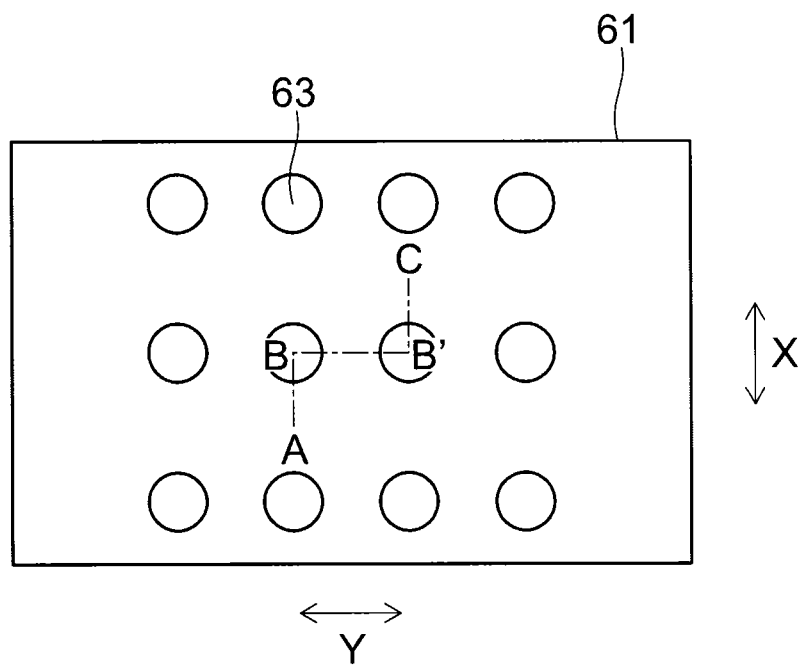

Then, as shown in FIGS. 7A and 7B, pillars 63 are filled into the holes 61a; and etch-back is performed until the upper surface of the sacrificial film 61 appears. The pillars 63 are, for example, silicon oxide films.

FIG. 7B is a top view of FIG. 7A; and FIG. 7A shows the A-B cross section, the B-B' cross section, and the B'-C cross section of FIG. 7B.

The multiple pillars 63 are arranged at different pitches in the X direction and the Y direction. The multiple pillars 63 are arranged in the Y direction at the first pitch. The multiple pillars 63 are arranged in the X direction at the second pitch. The second pitch is larger than the first pitch. In other words, the distance between the pillars 63 that are adjacent to each other in the X direction is greater than the distance between the pillars 63 that are adjacent to each other in the Y direction.

Figure 8A:
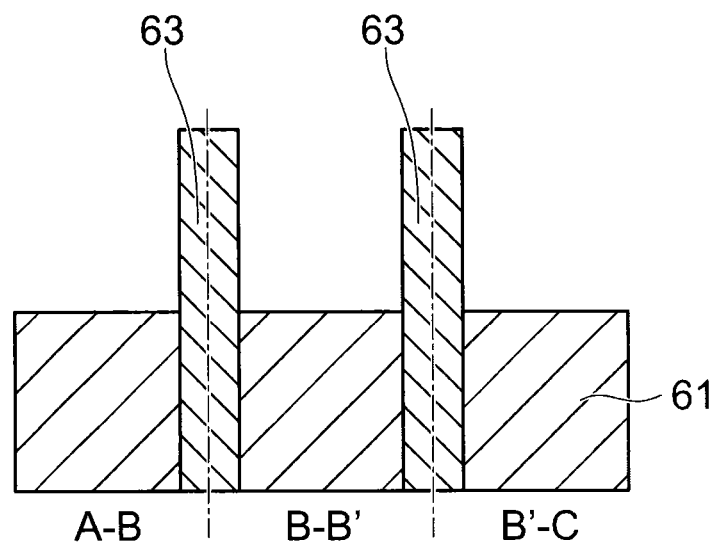

Then, the upper layer side of the sacrificial film 61 is slightly removed to expose the upper portions of the pillars 63 and cause the upper portions of the pillars 63 to protrude from the sacrificial film 61 as shown in FIG. 8A. FIG. 8A shows the same cross section as FIG. 7A.

Figure 8B:
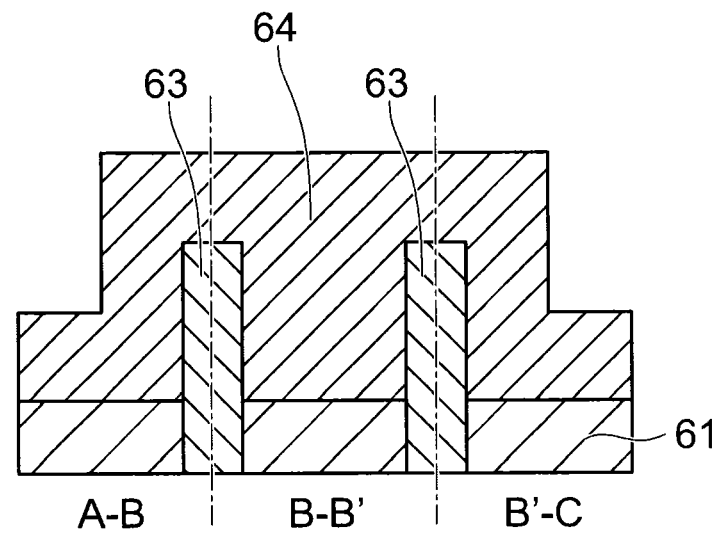

Continuing as shown in FIG. 8B, a sidewall film 64 is formed on the sacrificial film 61. FIG. 8B shows the same cross section as FIG. 8A. The sidewall film 64 is, for example, a silicon oxide film.

The sidewall film 64 covers the upper surface of the sacrificial film 61 and the side walls and upper surfaces of the pillars 63. The space between the pillars 63 that are adjacent to each other in the Y direction is filled with the sidewall film 64.

The X-direction pitch of the multiple pillars 63 is larger than the Y-direction pitch. Although the film thickness of the sidewall film 64 that is formed on the outer circumferential surface of one pillar 63 is the same in the X direction and the Y direction, a gap is made between the pillars 63 that are adjacent to each other in the X direction; and a gap is not made between the pillars 63 that are adjacent to each other in the Y direction.

Figure 9A:
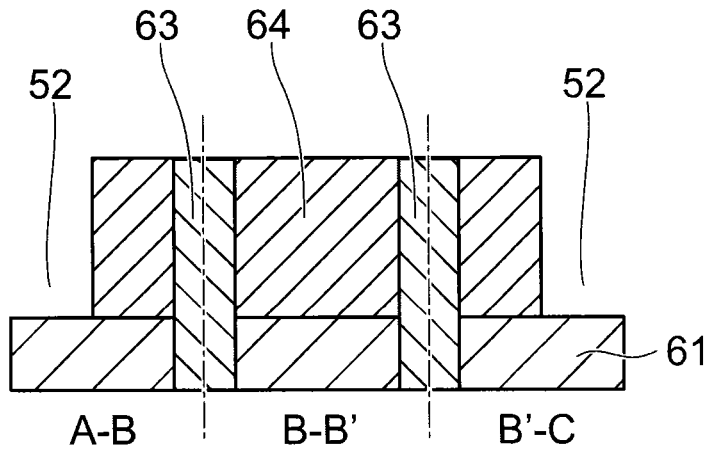
Figure 9B:
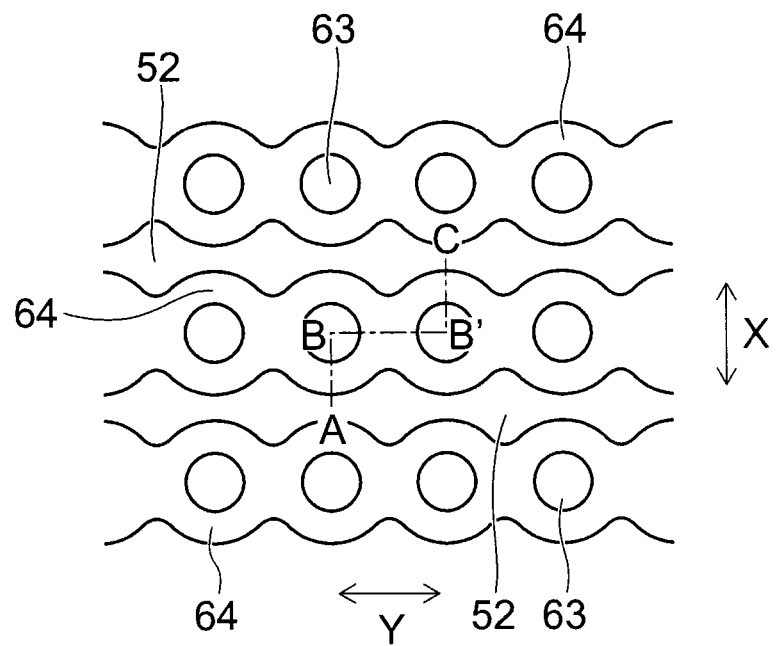

Then, as shown in FIGS. 9A and 9B, etch-back of the sidewall film 64 is performed until the upper surfaces of the pillars 63 and the upper surface of the sacrificial film 61 between the pillars 63 that are adjacent to each other in the X direction are exposed.

FIG. 9B is a top view of FIG. 9A; and FIG. 9A shows the A-B cross section, the B-B' cross section, and the B'-C cross section of FIG. 9B.

The sidewall film 64 remains between the pillars 63 that are adjacent to each other in the Y direction at a pitch that is smaller than the X-direction pitch. The sidewall film 64 extends in the Y direction around the outer circumferential surfaces of the pillars 63 to be linked in the Y direction. A slit 52 is made by the sidewall film 64 being removed such that a portion of the upper surface of the sacrificial film 61 is exposed between the pillars 63 that are adjacent to each other in the X direction.

The slit 52 that is made by removing the sidewall film 64 that is on the upper surface of the sacrificial film 61 extends in the Y direction to divide the sidewall film 64 in the X direction.

The side wall of the slit 52 is formed not in a linear configuration along the Y direction but in a configuration having an unevenness that repeats in a wave-like configuration along the Y direction. The side wall of the sidewall film 64 contacting the slit 52 also is formed in a configuration having an unevenness that repeats in a wave-like configuration along the Y direction.

Then, the sacrificial film (the hard mask) 61 is etched using a mask that is made of the pillars 63 and the sidewall film 64 that extends in the Y direction around the side walls of the pillars 63 to remain on the sacrificial film 61. The slit pattern of the slit 52 is transferred onto the sacrificial film 61.

Continuing, the stacked body described above that is under the sacrificial film 61 is etched using a mask that is made of the pillars 63 and the sacrificial film 61 onto which the slit pattern is transferred.

Figure 10A:
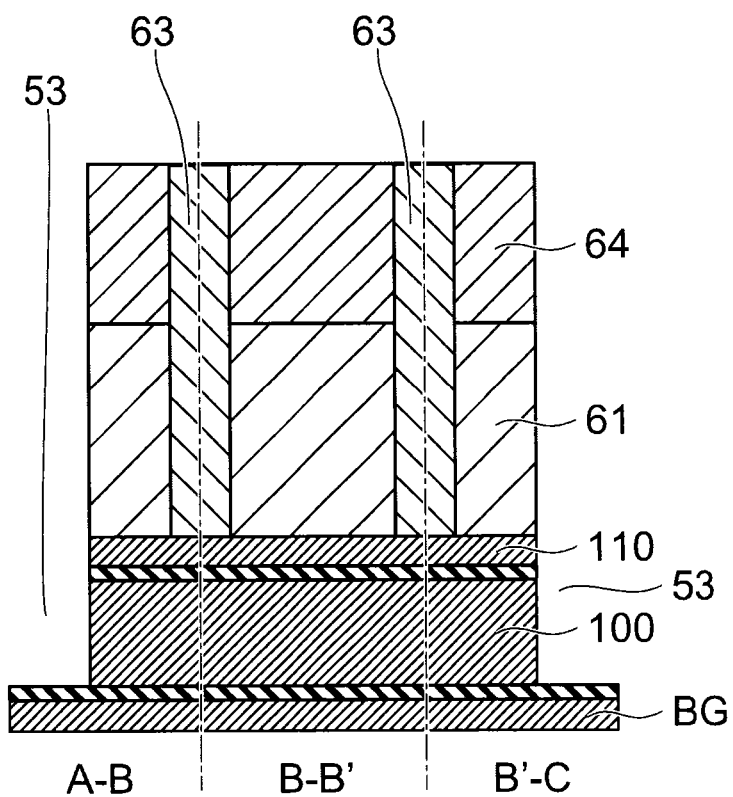
Figure 10B:
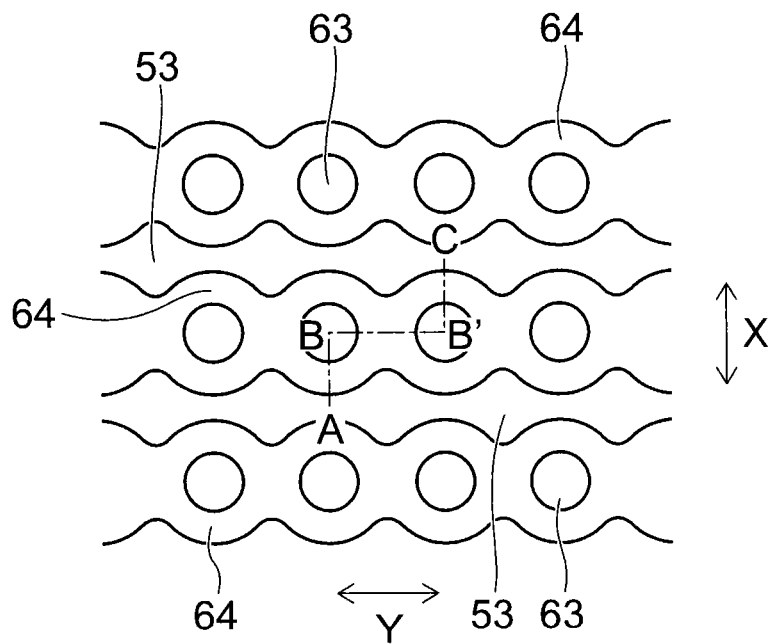

FIG. 10B is a top view of FIG. 10A; and FIG. 10A shows the A-B cross section, the B-B' cross section, and the B'-C cross section of FIG. 10B.

In FIG. 10A, a stacked body 100 that is provided on the back gate BG with an insulating film interposed corresponds to the stacked body that includes the electrode layers WL of the multiple layers; and a stacked body 110 that is provided on the stacked body 100 with an insulating film interposed corresponds to the stacked body that includes the selection gates SG.

A slit 53 is made in the stacked body 110 and the stacked body 100 by etching using the sacrificial film 61, the sidewall film 64, and the pillars 63 as a mask. The slit 53 extends in the Y direction to divide the stacked bodies 100 and 110 in the X direction.

As shown in FIG. 10B, the side wall of the slit 53 is formed not in a linear configuration along the Y direction but in a configuration having an unevenness that repeats in a wave-like configuration along the Y direction. The side walls of the stacked bodies 100 and 110 contacting the slit 53 also are formed in configurations having an unevenness that repeats in wave-like configurations along the Y direction.

Figure 11A:
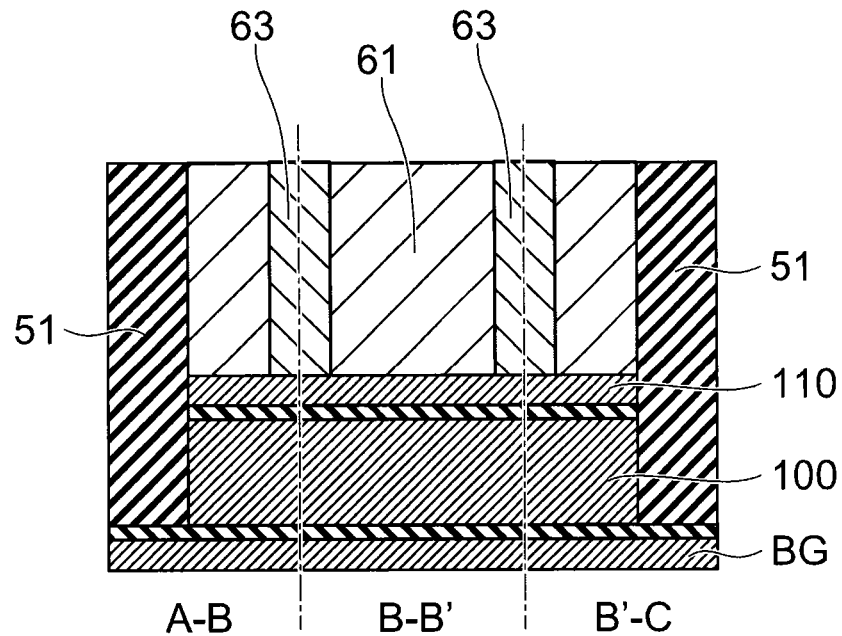
Figure 11B:
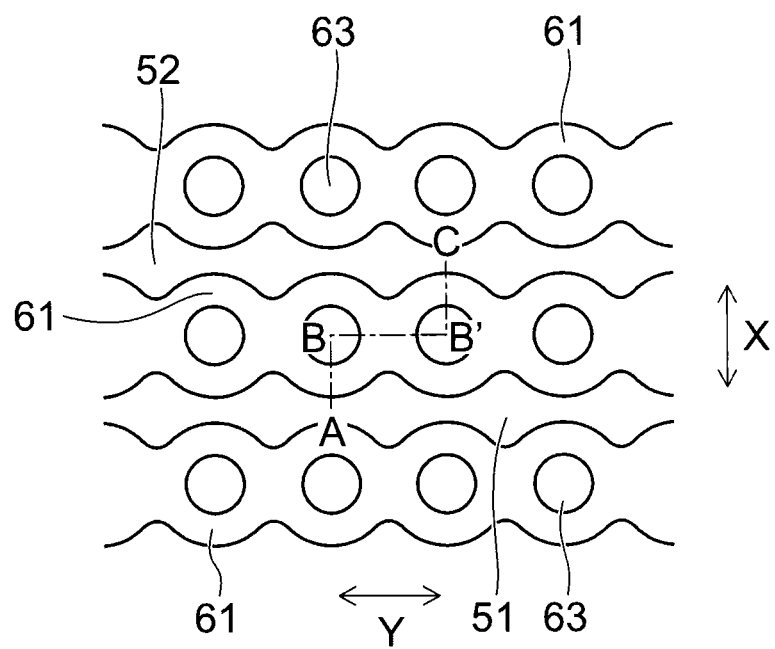

As shown in FIGS. 11A and 11B, the insulating separation film 51 is filled into the slit 53; and etch-back is performed until the upper surfaces of the pillars 63 and the upper surface of the sacrificial film 61 are exposed. The insulating separation film 51 is, for example, a silicon nitride film.

FIG. 11B is a top view of FIG. 11A; and FIG. 11A shows the A-B cross section, the B-B' cross section, and the B'-C cross section of FIG. 11B.

The insulating separation film 51 extends in the Y direction to divide the stacked bodies 100 and 110 in the X direction. The side wall of the insulating separation film 51 is formed in a configuration having an unevenness that repeats in a wave-like configuration along the Y direction.

Figure 12A:
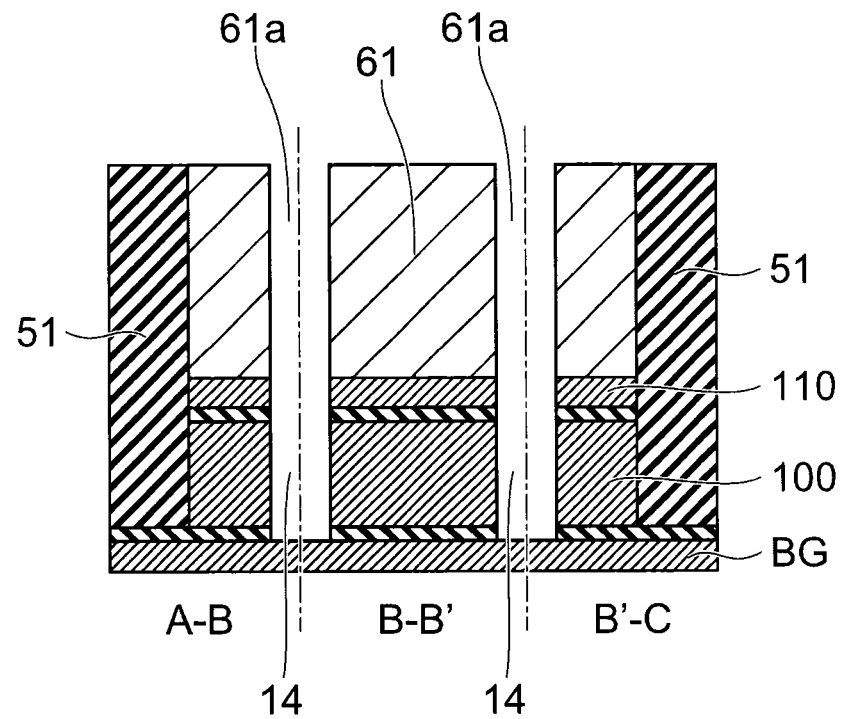
Figure 12B:
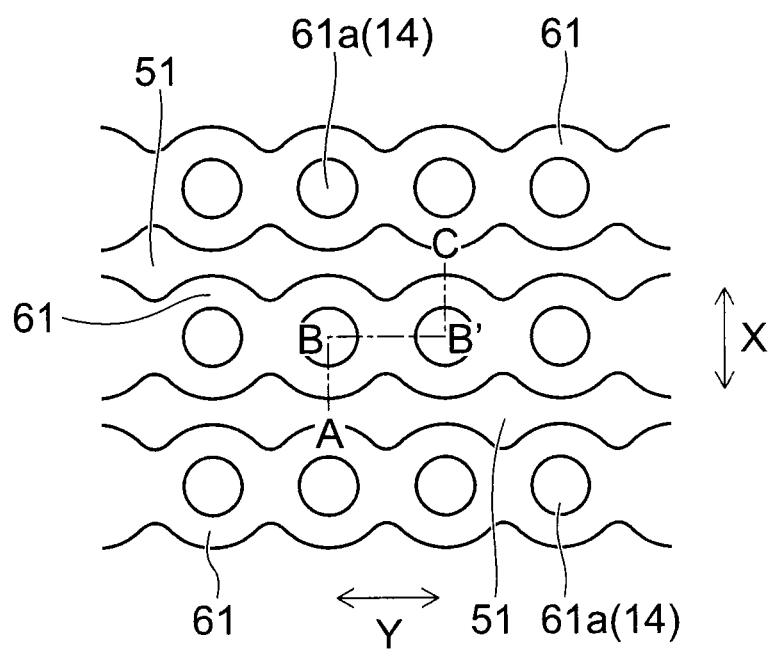

Then, multiple holes 14 are made in the stacked bodies 110 and 100 as shown in FIGS. 12A and 12B by removing the pillars 63 by, for example, wet processing, etc., and by etching using the sacrificial film 61 after the removal of the pillars 63 as a mask.

FIG. 12B is a top view of FIG. 12A; and FIG. 12A shows the A-B cross section, the B-B' cross section, and the B'-C cross section of FIG. 12B.

The holes 14 are made under the portions where the pillars 63 were made. The multiple holes 14 are arranged at different pitches in the X direction and the Y direction. The multiple holes 14 are arranged in the Y direction at the first pitch. The multiple holes 14 are arranged in the X direction at the second pitch. The second pitch is larger than the first pitch. In other words, the distance between the holes 14 that are adjacent to each other in the X direction is greater than the distance between the holes 14 that are adjacent to each other in the Y direction.

Figure 4A:
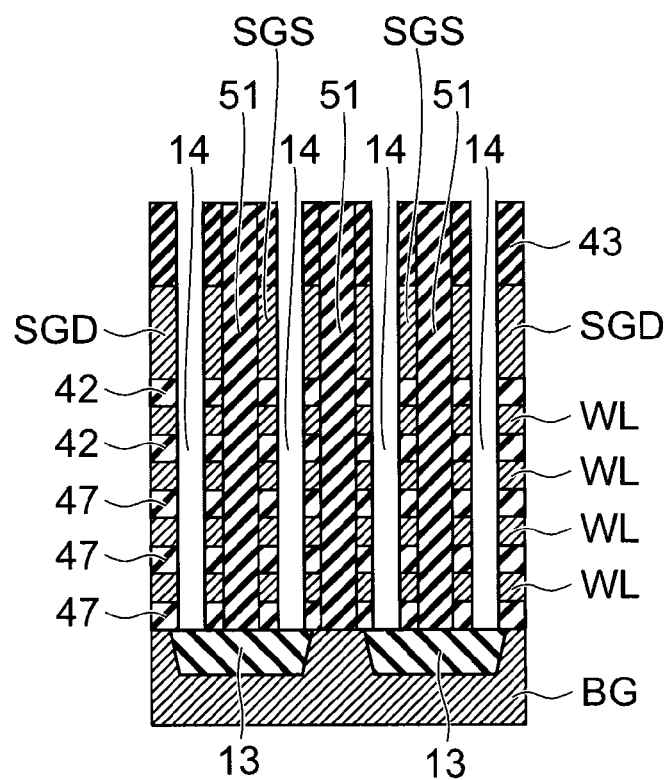

FIG. 4A shows the state in which the holes 14 are made in the stacked body that includes the electrode layers WL of the multiple layers. The holes 14 pierce the stacked body to reach the sacrificial film 13 that is filled into the back gate BG.

Figure 4B:
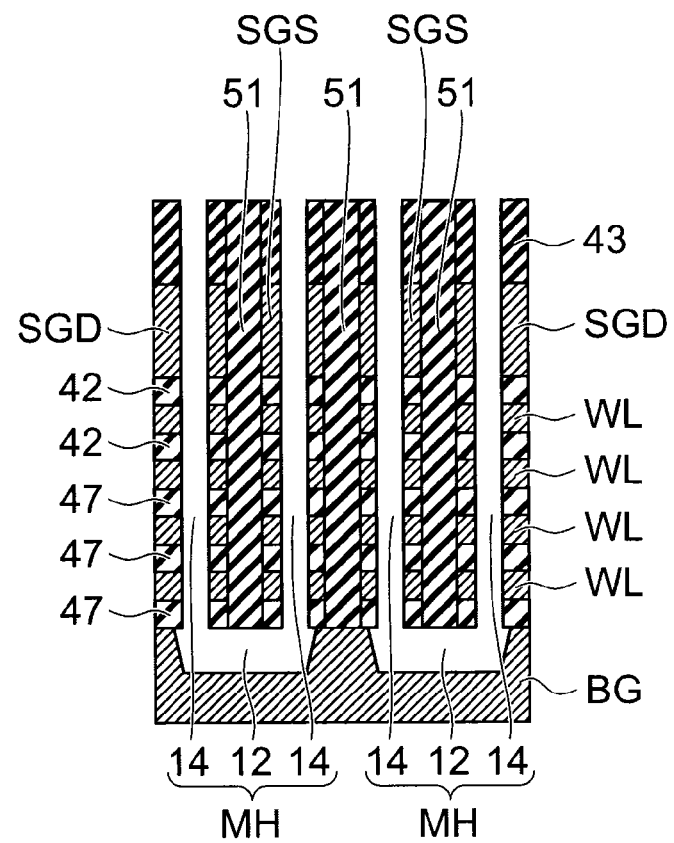

The sacrificial film 13 is removed by etching via the holes 14. Thereby, as shown in FIG. 4B, the memory hole MH having the U-shaped configuration is made in the stacked body that includes the back gate BG, the electrode layers WL of the multiple layers, the drain-side selection gate SGD, and the source-side selection gate SGS.

As shown in FIG. 1, the memory film 30 and the channel body 20 are formed in order on the inner wall of the memory hole MH.

According to the first embodiment described above, holes are made by a lithography process to correspond to the memory holes; and subsequently, the pillars 63 are filled into the holes that are made. Then, by using the multiple pillars 63 as starting points, the slit 53 can be made to divide the stacked body without using a new lithography process.

The etching mask for patterning the slit can be formed self-aligningly with respect to the memory hole pattern (the pillars 63) by forming the sidewall film 64 on and around the side walls of the multiple pillars 63 arranged at different pitches in the X direction and the Y direction.

By etching the stacked body using the mask, the slit pattern can be formed self-aligningly with respect to the memory hole pattern. It is unnecessary to use a new lithography process to make the slit. Accordingly, the memory hole formation defects (deformation and disappearance) caused by the alignment shift of the slit and the memory holes can be prevented.

Second Embodiment

FIG. 13A to FIG. 17B are schematic views showing a method for making the memory holes and the slit according to a second embodiment.

Figure 13A:
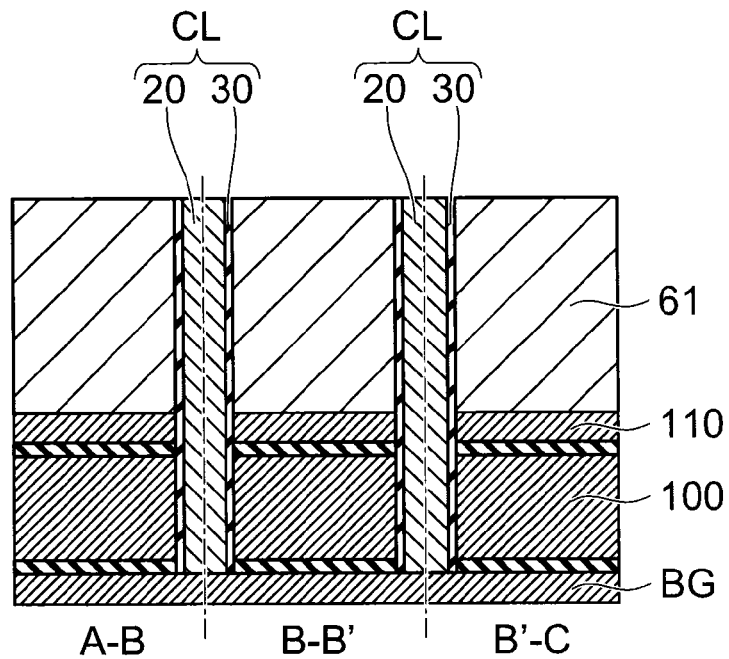
FIG. 13A to FIG. 17B are schematic views showing a method for manufacturing a semiconductor memory device of a second embodiment.
Figure 13B:
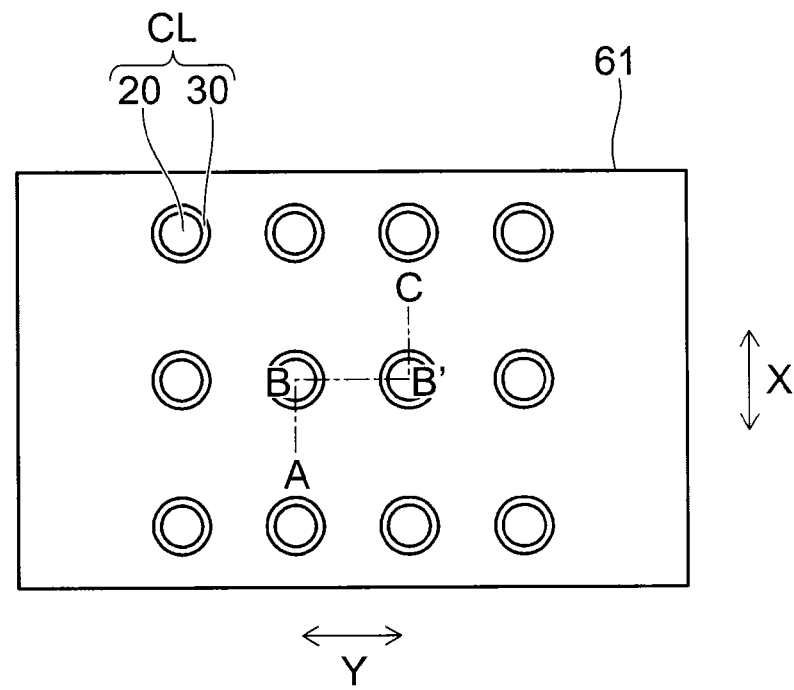

FIG. 13B is a top view of FIG. 13A; and FIG. 13A shows the A-B cross section, the B-B' cross section, and the B'-C cross section of FIG. 13B.

Similarly to the first embodiment, the sacrificial film (the hard mask) 61 is formed on the stacked bodies 100 and 110; and subsequently, multiple holes are made in the sacrificial film 61.

Then, holes are made in the stacked bodies 110 and 100 by etching using a mask that is made of the sacrificial film 61 in which the holes are made.

As shown in FIGS. 13A and 13B, the memory film 30 and the channel body 20 are formed in order on the inner walls of the holes made in the sacrificial film 61 and on the inner walls of the holes made in the stacked bodies 110 and 100.

In other words, the pillars CL made of the stacked films of the memory film 30 and the channel body 20 are filled into the holes made in the sacrificial film 61 and into the holes made in the stacked bodies 110 and 100.

The multiple pillars CL are arranged at different pitches in the X direction and the Y direction. The multiple pillars CL are arranged in the Y direction at the first pitch. The multiple pillars CL are arranged in the X direction at the second pitch. The second pitch is larger than the first pitch. In other words, the distance between the pillars CL that are adjacent to each other in the X direction is greater than the distance between the pillars CL that are adjacent to each other in the Y direction.

Figure 14A:
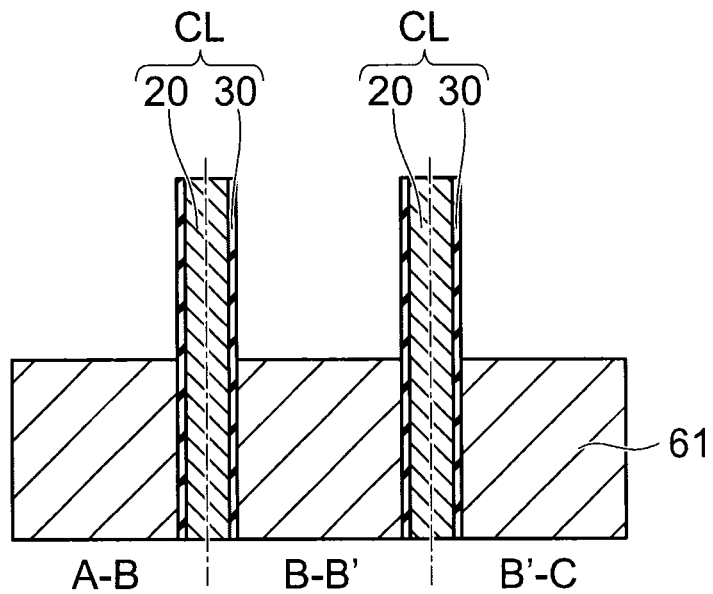

Then, the upper layer side of the sacrificial film 61 is slightly removed to expose the upper portions of the pillars CL and cause the upper portions of the pillars CL to protrude from the sacrificial film 61 as shown in FIG. 14A. FIG. 14A shows the same cross section as FIG. 13A.

Figure 14B:
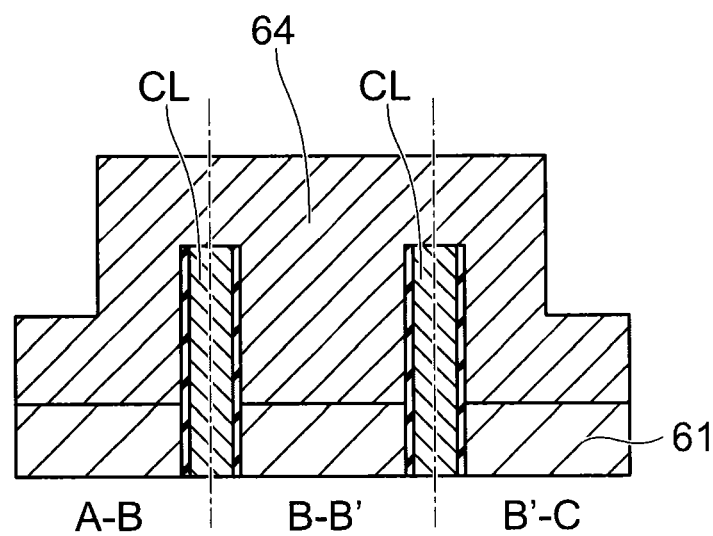

Continuing as shown in FIG. 14B, the sidewall film 64 is formed on the sacrificial film 61. FIG. 14B shows the same cross section as FIG. 14A.

The sidewall film 64 covers the upper surface of the sacrificial film 61 and the side walls and upper surfaces of the pillars CL. The space between the pillars CL that are adjacent to each other in the Y direction is filled with the sidewall film 64.

The X-direction pitch of the multiple pillars CL is larger than the Y-direction pitch. Therefore, the thickness of the sidewall film 64 on the sacrificial film 61 between the pillars CL that are adjacent to each other in the X direction is thinner than the thickness of the sidewall film 64 filled between the pillars CL that are adjacent to each other in the Y direction.

Figure 15A:
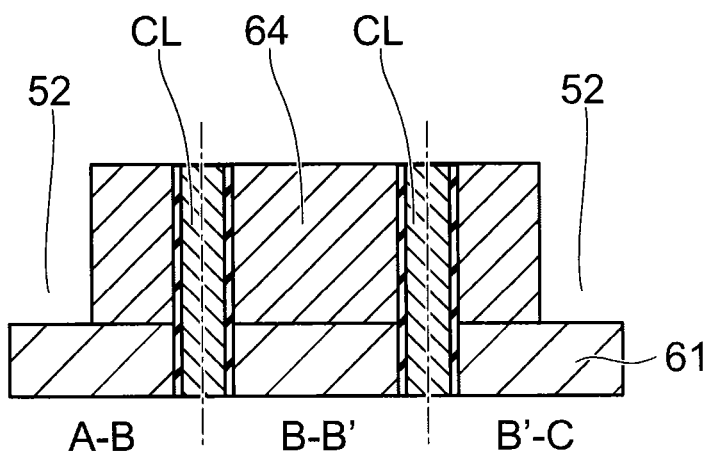
Figure 15B:
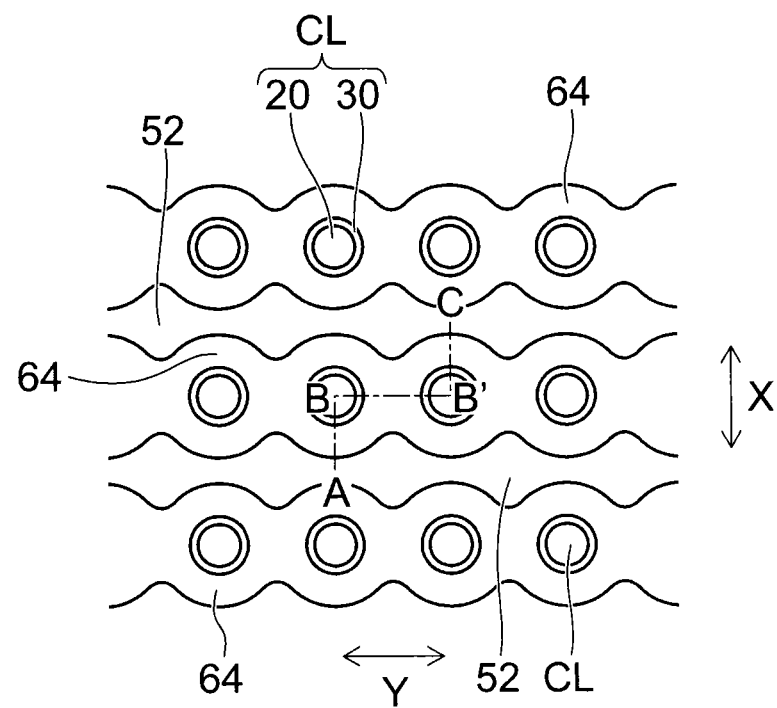

Then, as shown in FIGS. 15A and 15B, etch-back of the sidewall film 64 is performed until the upper surfaces of the pillars CL and the upper surface of the sacrificial film 61 between the pillars CL that are adjacent to each other in the X direction are exposed.

FIG. 15B is a top view of FIG. 15A; and FIG. 15A shows the A-B cross section, the B-B' cross section, and the B'-C cross section of FIG. 15B.

The sidewall film 64 remains between the pillars CL that are adjacent to each other in the Y direction at a pitch that is smaller than the X-direction pitch. The sidewall film 64 extends in the Y direction around the outer circumferential surfaces of the pillars CL to be linked in the Y direction. The slit 52 is made by the sidewall film 64 being removed such that a portion of the upper surface of the sacrificial film 61 is exposed between the pillars CL that are adjacent to each other in the X direction.

The slit 52 that is made by removing the sidewall film 64 that is on the upper surface of the sacrificial film 61 extends in the Y direction to divide the sidewall film 64 in the X direction.

The side wall of the slit 52 is formed in a configuration having an unevenness that repeats in a wave-like configuration along the Y direction. The side wall of the sidewall film 64 contacting the slit 52 is formed in a configuration having an unevenness that repeats in a wave-like configuration along the Y direction.

Then, the sacrificial film 61 is etched using a mask that is made of the pillars CL and the sidewall film 64 that extends in the Y direction around the side walls of the pillars CL to remain on the sacrificial film 61. The slit pattern of the slit 52 is transferred onto the sacrificial film 61.

Continuing, the stacked body described above that is under the sacrificial film 61 is etched using a mask that is made of the pillars CL and the sacrificial film 61 onto which the slit pattern is transferred.

Figure 16A:
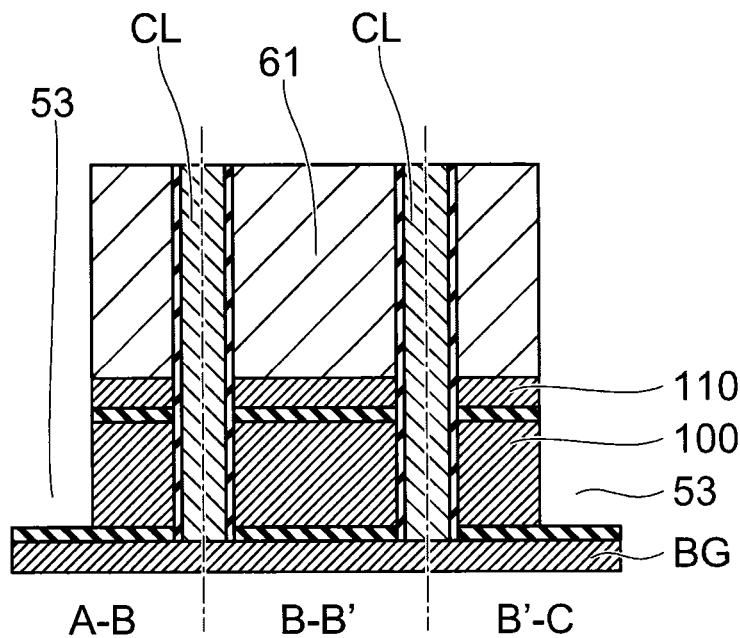
Figure 16B:
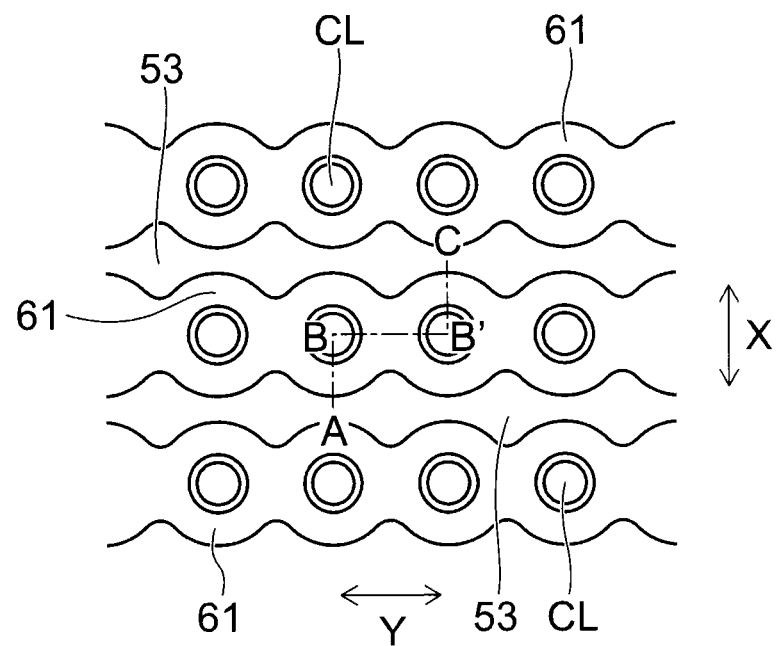

FIG. 16B is a top view of FIG. 16A; and FIG. 16A shows the A-B cross section, the B-B' cross section, and the B'-C cross section of FIG. 16B.

The slit 53 is made in the stacked body 110 and the stacked body 100 by etching using the sacrificial film 61 and the pillars CL as a mask. The slit 53 extends in the Y direction to divide the stacked bodies 100 and 110 in the X direction.

As shown in FIG. 16B, the side wall of the slit 53 is formed in a configuration having an unevenness that repeats in a wave-like configuration along the Y direction. The side walls of the stacked bodies 100 and 110 contacting the slit 53 are formed in configurations having an unevenness that repeats in wave-like configurations along the Y direction.

Figure 17A:
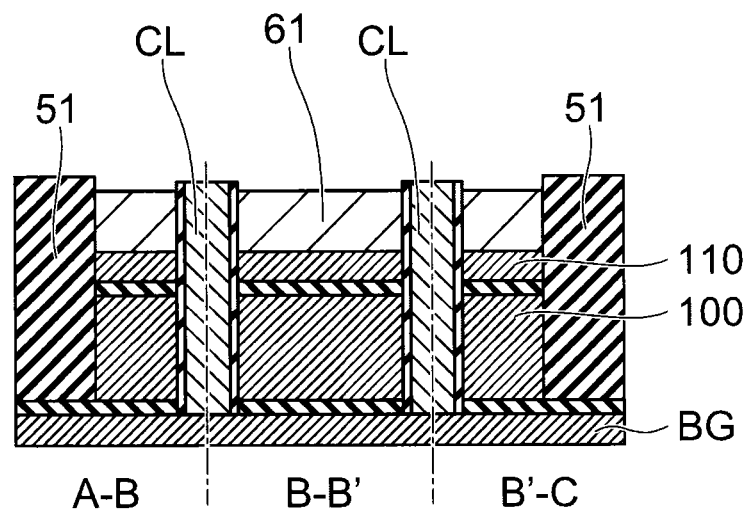
Figure 17B:
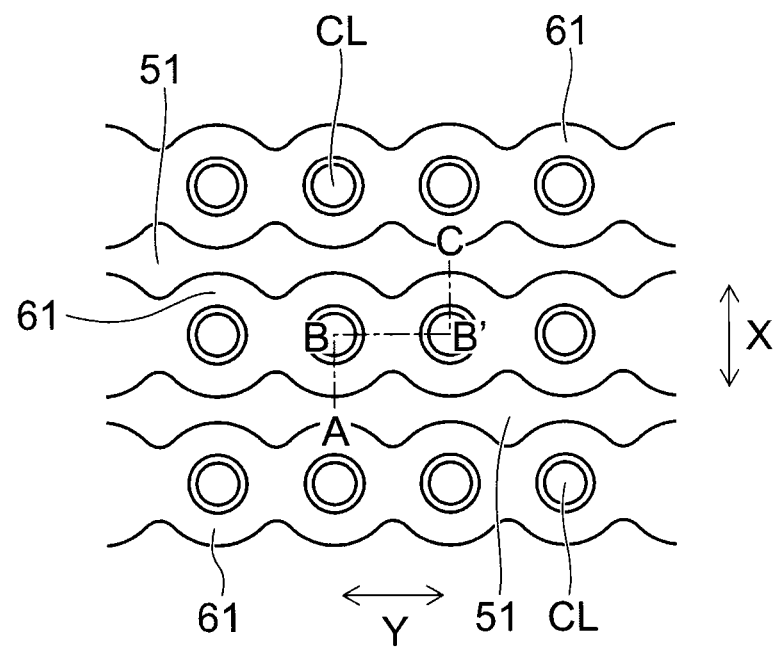

As shown in FIGS. 17A and 17B, the insulating separation film 51 is filled into the slit 53; and etch-back is performed until the upper surfaces of the pillars CL and the upper surface of the sacrificial film 61 are exposed.

FIG. 17B is a top view of FIG. 17A; and FIG. 17A shows the A-B cross section, the B-B' cross section, and the B'-C cross section of FIG. 17B.

The insulating separation film 51 extends in the Y direction to divide the stacked bodies 100 and 110 in the X direction. The side wall of the insulating separation film 51 is formed in a configuration having an unevenness that repeats in a wave-like configuration along the Y direction.

According to the second embodiment, after making the memory holes by a lithography process, the pillars CL made of the stacked films of the memory film 30 and the channel body 20 are filled into the holes. Then, by using the multiple pillars CL as starting points, the slit 53 that divides the stacked body can be made without using a new lithography process.

The etching mask for patterning the slit can be formed self-aligningly with respect to the memory hole pattern (the pillars CL) by forming the sidewall film 64 on and around the side walls of the multiple pillars CL arranged at different pitches in the X direction and the Y direction.

The slit pattern can be formed self-aligningly with respect to the memory hole pattern by etching the stacked body using the mask. It is unnecessary to use a new lithography process to make the slit. Accordingly, the memory hole formation defects (deformation and disappearance) caused by the alignment shift of the slit and the memory holes can be prevented.

Third Embodiment

FIG. 18A to FIG. 21B are schematic views showing a method for making the memory holes and the slit according to a third embodiment.

Figure 18A:
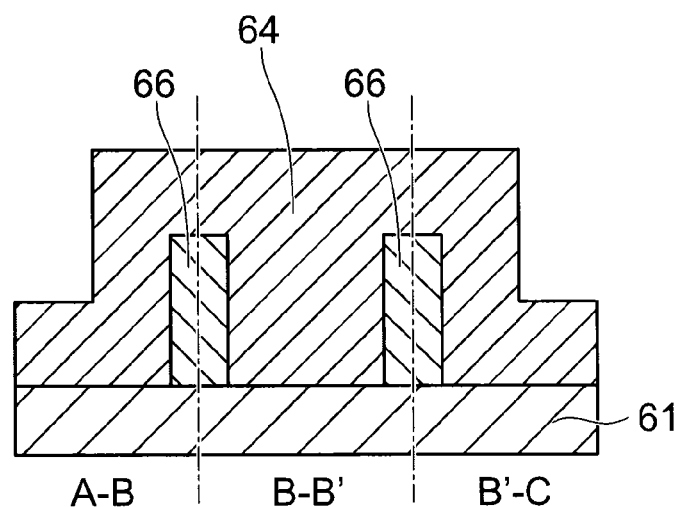
FIG. 18A to FIG. 21B are schematic views showing a method for manufacturing a semiconductor memory device of a third embodiment.

Similarly to the first embodiment, the sacrificial film 61 is formed on the stacked body shown in FIG. 3D; and subsequently, core members (pillars) 66 of, for example, a resist film are patterned on the sacrificial film 61 as shown in FIG. 18A.

The multiple pillars 66 are arranged at different pitches in the X direction and the Y direction. The multiple pillars 66 are arranged in the Y direction at the first pitch. The multiple pillars 66 are arranged in the X direction at the second pitch. The second pitch is larger than the first pitch. In other words, the distance between the pillars 66 that are adjacent to each other in the X direction is greater than the distance between the pillars 66 that are adjacent to each other in the Y direction.

Then, after forming the pillars 66, the sidewall film 64 is formed on the sacrificial film 61. The sidewall film 64 covers the upper surface of the sacrificial film 61 and the side walls and upper surfaces of the pillars 66. The space between the pillars 66 that are adjacent to each other in the Y direction is filled with the sidewall film 64.

The X-direction pitch of the multiple pillars 66 is larger than the Y-direction pitch. Although the film thickness of the sidewall film 64 formed on the outer circumferential surface of one pillar 66 is the same in the X direction and the Y direction, a gap is made between the pillars 66 that are adjacent to each other in the X direction; and a gap is not made between the pillars 66 that are adjacent to each other in the Y direction.

Figure 18B:
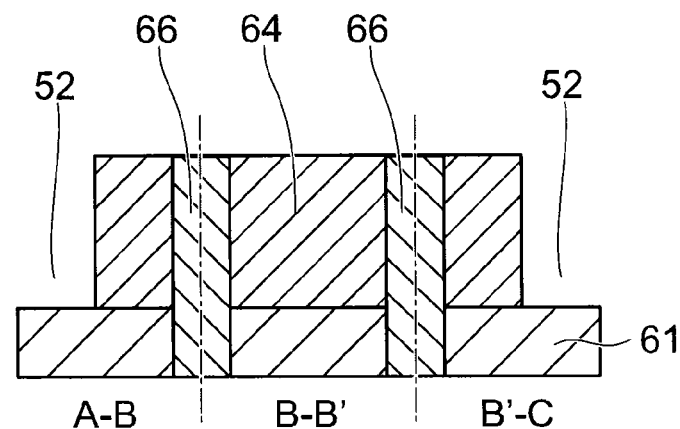
Figure 18C:
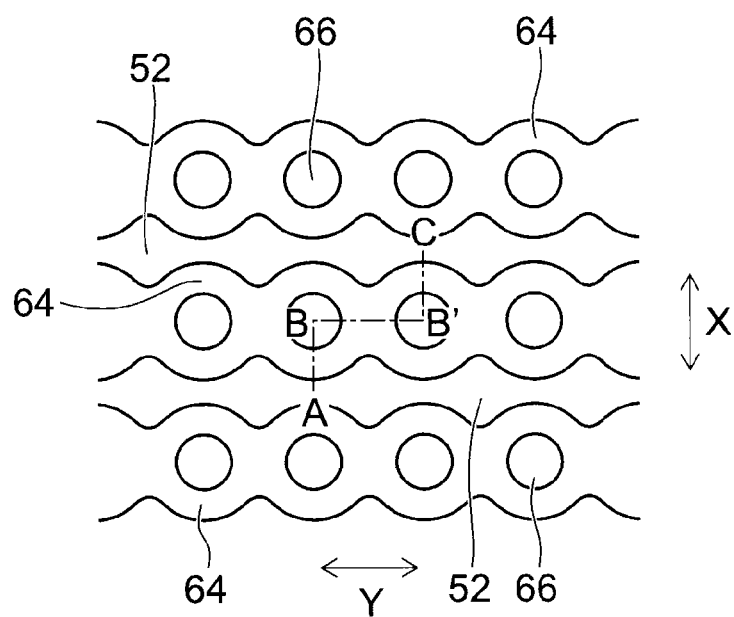

Then, as shown in FIGS. 18B and 18C, etch-back of the sidewall film 64 is performed until the upper surfaces of the pillars 66 and the upper surface of the sacrificial film 61 between the pillars 66 that are adjacent to each other in the X direction are exposed.

FIG. 18C is a top view of FIG. 18B; and FIG. 18B shows the A-B cross section, the B-B' cross section, and the B'-C cross section of FIG. 18C.

The sidewall film 64 remains between the pillars 66 that are adjacent to each other in the Y direction at a pitch that is smaller than the X-direction pitch. The sidewall film 64 extends in the Y direction around the outer circumferential surfaces of the pillars 66 to be linked in the Y direction. The slit 52 is made by the sidewall film 64 being removed such that a portion of the upper surface of the sacrificial film 61 between the pillars 66 that are adjacent to each other in the X direction is exposed.

The slit 52 that is made by removing the sidewall film 64 that is on the upper surface of the sacrificial film 61 extends in the Y direction to divide the sidewall film 64 in the X direction.

The side wall of the slit 52 is formed in a configuration having an unevenness that repeats in a wave-like configuration along the Y direction. The side wall of the sidewall film 64 contacting the slit 52 also is formed in a configuration having an unevenness that repeats in a wave-like configuration along the Y direction.

Figure 19A:
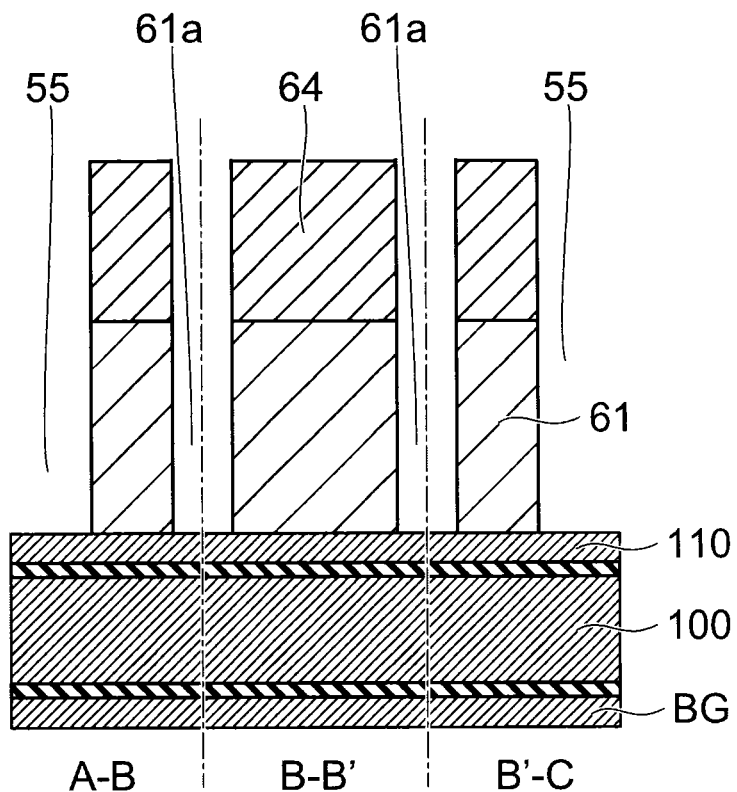
Figure 19B:
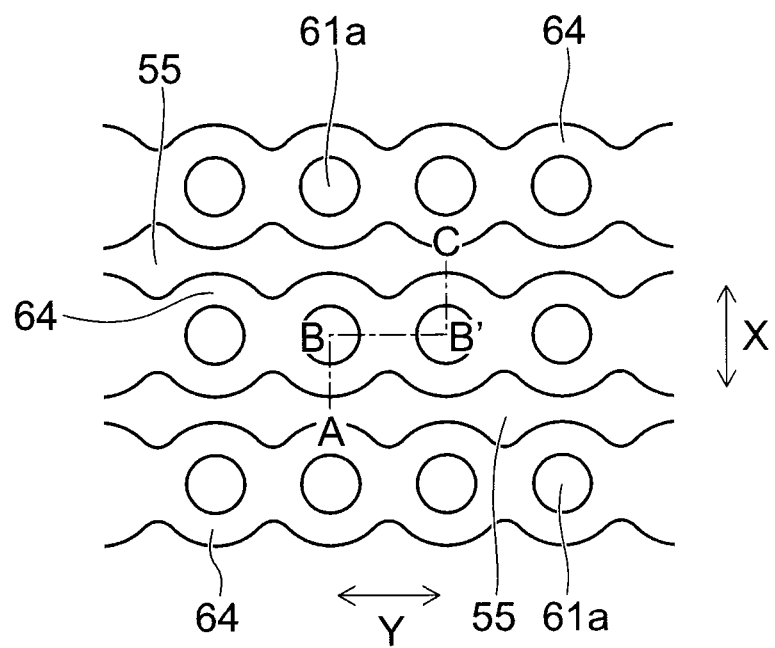

Then, multiple holes are made in the sidewall film 64 by removing the pillars 66 by, for example, wet processing. Continuing, the multiple holes 61a are made in the sacrificial film 61 as shown in FIGS. 19A and 19B by etching using a mask that is made of the sidewall film 64 in which the holes are made. By the etching, a slit 55 is made in the sacrificial film 61 simultaneously with the holes 61a.

FIG. 19B is a top view of FIG. 19A; and FIG. 19A shows the A-B cross section, the B-B' cross section, and the B'-C cross section of FIG. 19B.

Then, the stacked bodies 110 and 100 are etched using the sacrificial film 61 and the sidewall film 64 as a mask.

Figure 20A:
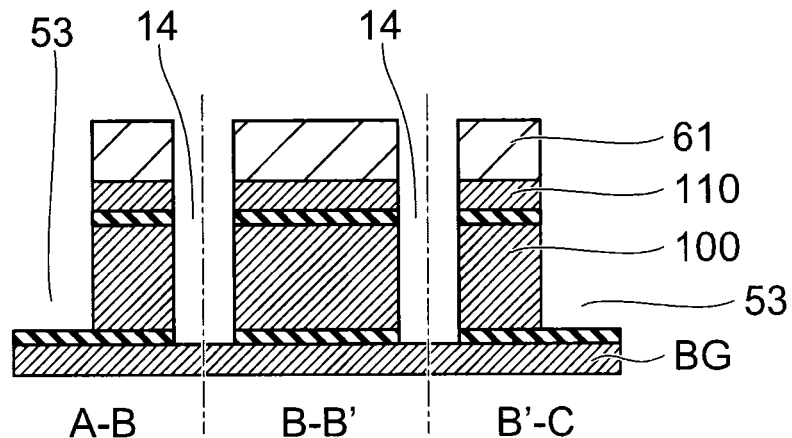
Figure 20B:
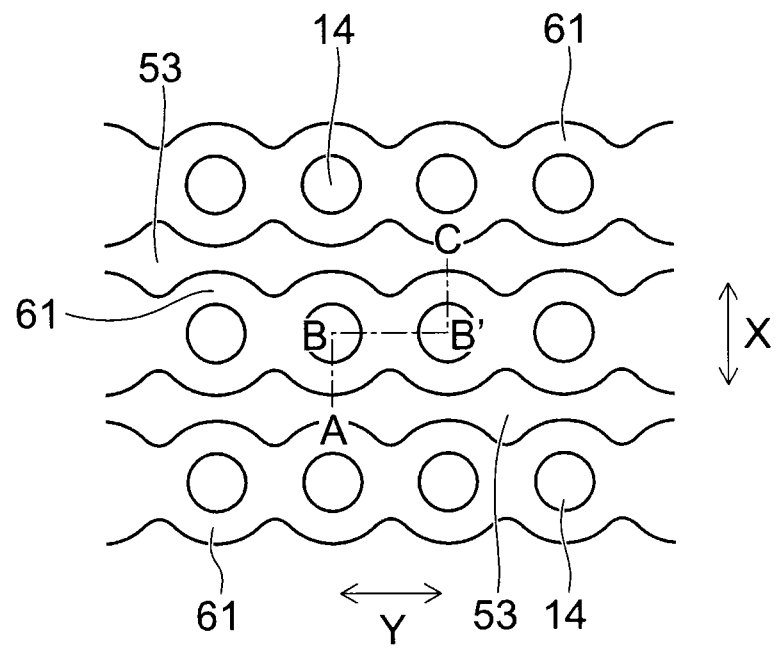

FIG. 20B is a top view of FIG. 20A; and FIG. 20A shows the A-B cross section, the B-B' cross section, and the B'-C cross section of FIG. 20B.

The holes 14 and the slit 53 are made simultaneously in the stacked body 110 and the stacked body 100 by etching using the sacrificial film 61 and the sidewall film 64 as a mask.

The slit 53 extends in the Y direction to divide the stacked bodies 100 and 110 in the X direction. As shown in FIG. 20B, the side wall of the slit 53 is formed in a configuration having an unevenness that repeats in a wave-like configuration along the Y direction. The side walls of the stacked bodies 100 and 110 contacting the slit 53 also are formed in configurations having an unevenness that repeats in wave-like configurations along the Y direction.

Figure 21A:
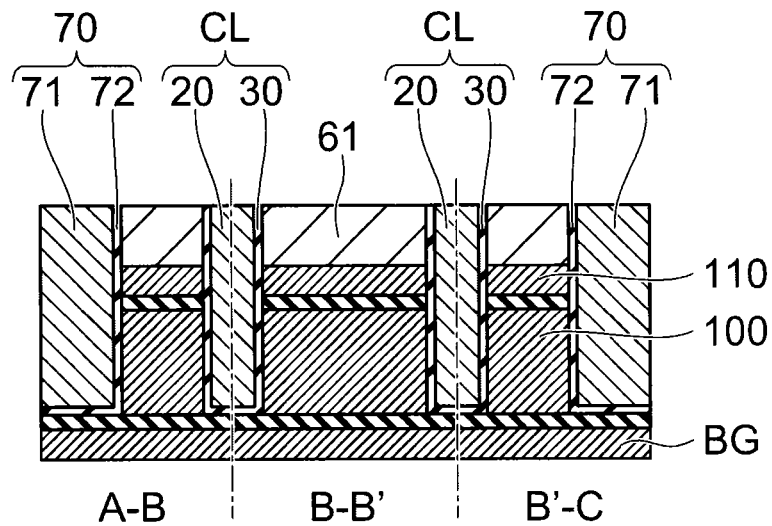
Figure 21B:
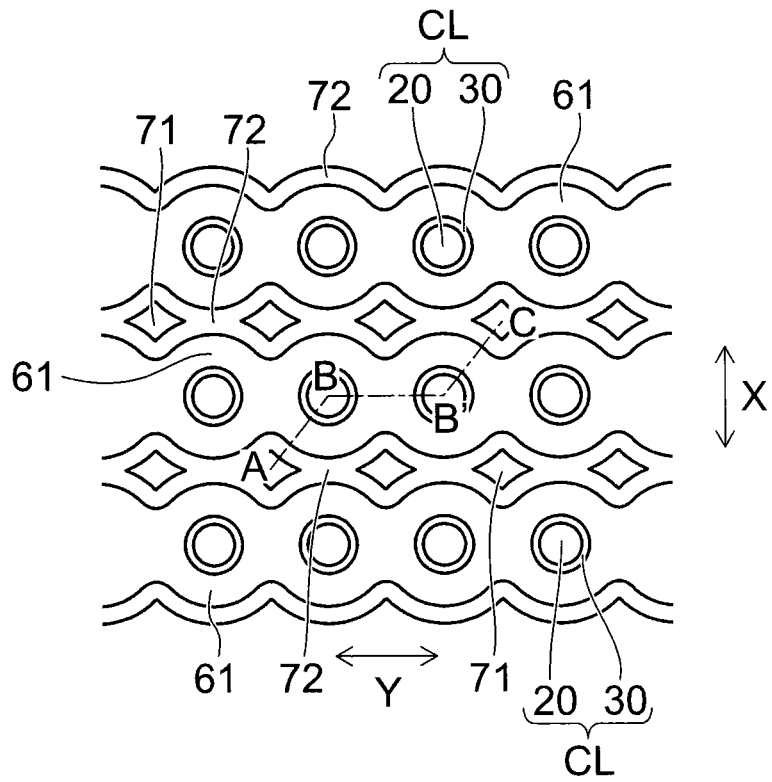

As shown in FIGS. 21A and 21B, the memory film 30 and the channel body 20 are formed in order on the inner walls of the holes 14.

FIG. 21B is a top view of FIG. 21A; and FIG. 21A shows the A-B cross section, the B-B' cross section, and the B'-C cross section of FIG. 21B.

Simultaneously with the formation of the memory film 30 and the channel body 20 inside the holes 14, an insulating separation film 70 made of a stacked film of a film 72 and a film 71 is filled into the slit 53.

The insulating separation film 70 extends in the Y direction to divide the stacked bodies 100 and 110 in the X direction. The side wall of the insulating separation film 70 is formed in a configuration having an unevenness that repeats in a wave-like configuration along the Y direction.

The film 72 is a film of the same material as that of the memory film 30 and is formed simultaneously with the memory film 30. The film 71 is a film of the same material as that of the channel body 20 and is formed simultaneously with the channel body 20.

As shown in FIG. 21B, the film 72 is formed on the side walls of the stacked bodies 110 and 100 along the Y direction.

The width (the width in the X direction) of the insulating separation film 70 is nonuniform and has a relatively large portion and a relatively small portion. The portion of the insulating separation film 70 having the relatively large width is repeated periodically in the Y direction alternately with the portion of the insulating separation film 70 having the relatively small width. The portion of the insulating separation film 70 having the relatively small width is plugged with the film 72.

According to the third embodiment described above, the multiple pillars 66 corresponding to the memory holes are formed by a lithography process. Then, using the multiple pillars 66 as starting points, the slit 53 that divides the stacked body can be made without using a new lithography process.

The etching mask for patterning the slit can be formed self-alignedly with respect to the memory hole pattern (the pillars 66) by forming the sidewall film 64 on and around the side walls of the multiple pillars 66 that are arranged at different pitches in the X direction and the Y direction.

By etching the stacked body using the mask, the slit pattern can be formed self-alignedly with respect to the memory hole pattern. It is unnecessary to use a new lithography process to make the slit. Accordingly, the memory hole formation defects (deformation and disappearance) caused by the alignment shift of the slit and the memory holes can be prevented.

Figure 24A:
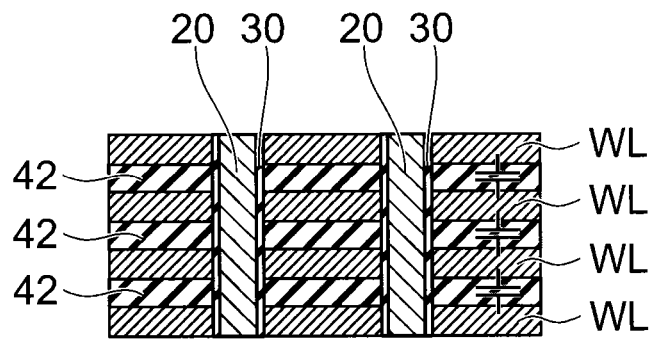
FIGS. 24A and 24B are schematic views of the semiconductor memory device of the embodiment.
Figure 24B:
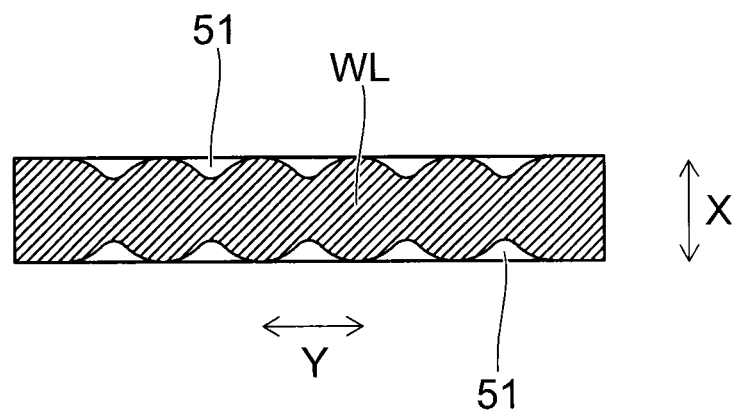

FIG. 24B is a schematic plan view of the electrode layers WL according to the embodiment.

The side walls of both width-direction (X-direction) ends of the electrode layer WL are formed not in linear configurations along the Y direction but in configurations having an unevenness that repeats in wave-like configurations along the Y direction. The width (the width in the X direction) of the electrode layer WL is nonuniform and has a relatively large portion and a relatively small portion. The portion of the electrode layer WL having the relatively large width is repeated periodically in the Y direction alternately with the portion of the electrode layer WL having the relatively small width. The insulating separation film 51 is formed to enter the recesses of the side walls of the electrode layer WL.

FIG. 24A is a schematic cross-sectional view of the stacked body in which the electrode layers WL of the multiple layers are stacked with the insulating layers 42 interposed.

A parasitic capacitance exists between the electrode layers WL that are stacked on and under the interposed insulating layer 42. According to the embodiment, the parasitic capacitance between the electrode layers WL on and under the interposed insulating layer 42 can be less than that of the case where the side walls of the electrode layers WL are formed in linear configurations by the amount that the recessed configurations reduce the electrode layers WL.

As shown in FIG. 22A, the multiple pillars CL (the memory holes) made of the stacked film of the memory film 30 and the channel body 20 are arranged in a square lattice configuration.

The protrusions of the side walls of the mutually-adjacent electrode layers WL oppose each other in the X direction with the insulating separation film 51 interposed at the portion of the insulating separation film 51 having the relatively small width. The recesses of the side walls of the mutually-adjacent electrode layers WL oppose each other in the X direction with the insulating separation film 51 interposed at the portion of the insulating separation film 51 having the relatively large width.

Figure 22B:
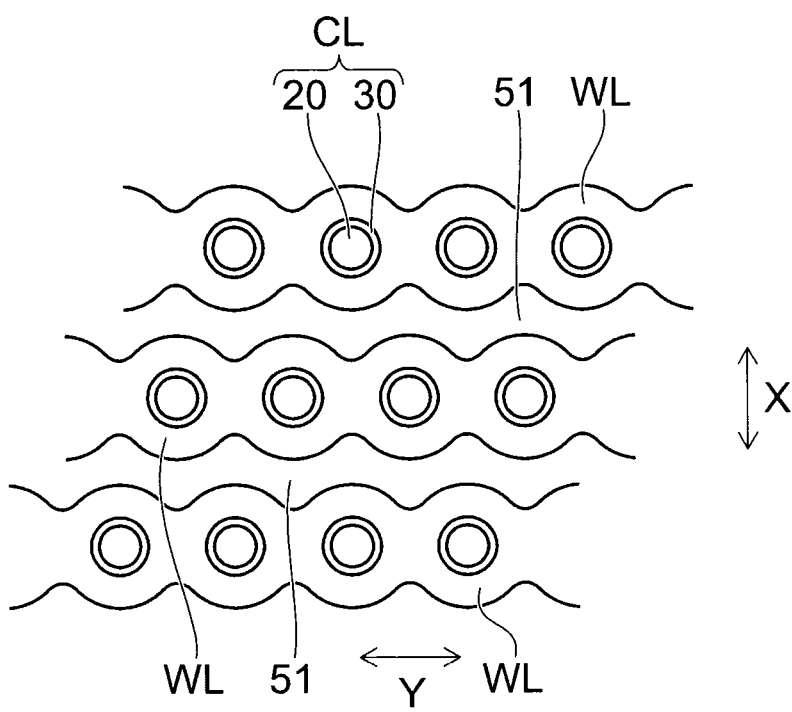

Also, as shown in FIG. 22B, the density of the pillars CL (the memory holes) can be increased by disposing the multiple pillars CL in a staggered lattice configuration.

According to the layout of FIG. 22B, the protrusion of the side wall of the electrode layer WL opposes, in the X direction, the recess of the side wall of the electrode layer WL adjacent in the X direction with the insulating separation film 51 interposed.

The multiple pillars CL that are arranged in the X direction are not limited to being arranged at uniform spacing.

Figure 23A:
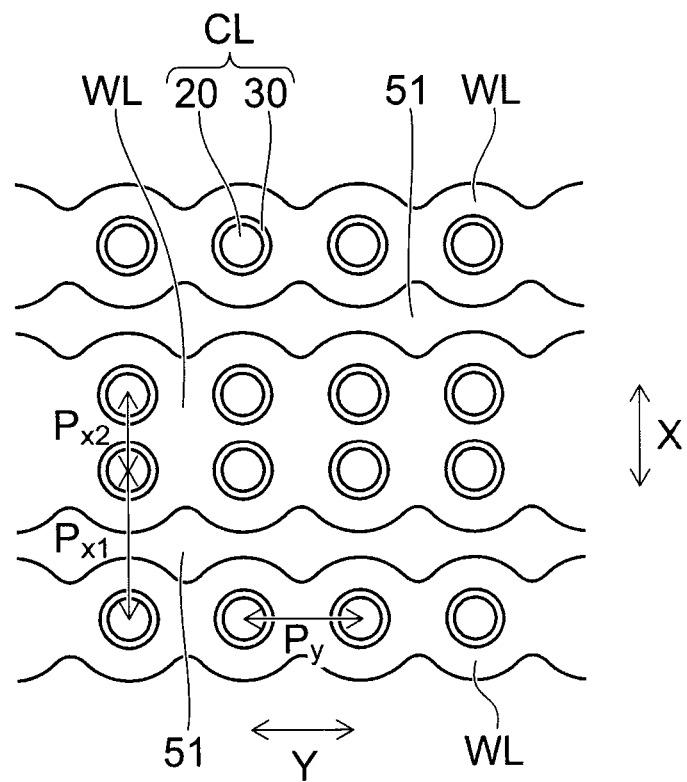

According to the layout of FIG. 23A, the columns of the multiple pillars CL that are arranged in the Y direction have a first pitch Py. The columns of the multiple pillars CL that are arranged in the X direction have a second pitch Px1 that is larger than the first pitch Py. Further, the columns of the multiple pillars CL that are arranged in the X direction have a third pitch Px2 that is smaller than the second pitch Px1.

When forming the sidewall film 64 described above, the sidewall film 64 is filled between the adjacent pillars that are separated from each other by the third pitch Px2; and the sidewall films 64 are linked to each other between the adjacent pillars that are separated from each other by the third pitch Px2. Subsequently, the sidewall film 64 remains between the adjacent pillars that are separated from each other by the third pitch Px2 even after the etch-back of the sidewall film 64.

Accordingly, the electrode layer WL between the adjacent pillars that are separated from each other by the third pitch Px2 is not divided in the X direction and is linked in the X direction. Therefore, the width of the stacked body in the X direction after making the slit, that is, the aspect ratio when patterning the stacked body, can be greater than that of the layout of FIG. 22A; and the patterning is easier.

Figure 23B:
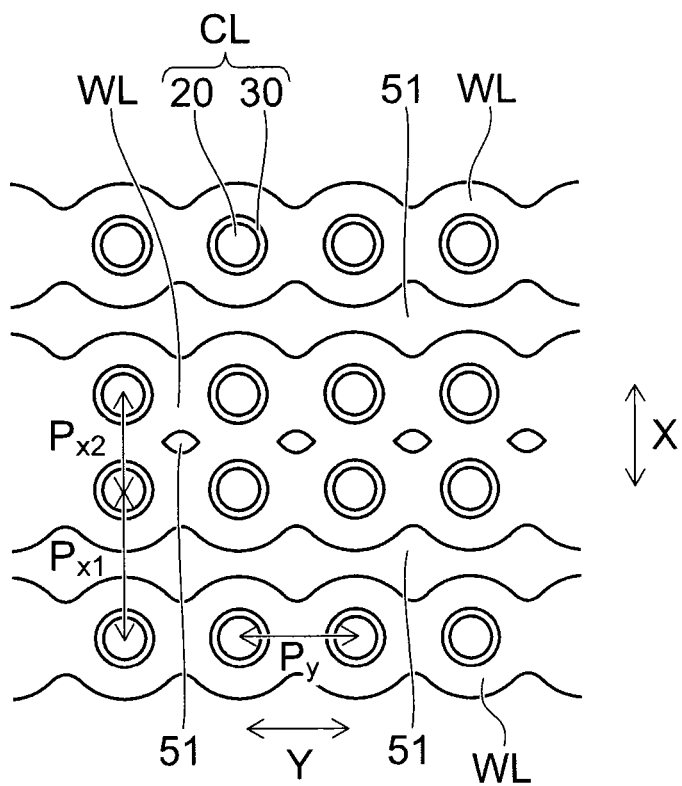

By adjusting the third pitch Px2 as shown in FIG. 23B, it is also possible to make a portion (a gap) where the electrode layer WL that is formed to straddle the two pillars CL adjacent to each other in the X direction is not continuous in the X direction. It is possible to silicide the side walls of the electrode layers WL via the gaps to reduce the resistance of the electrode layer WL.

Figure 25:
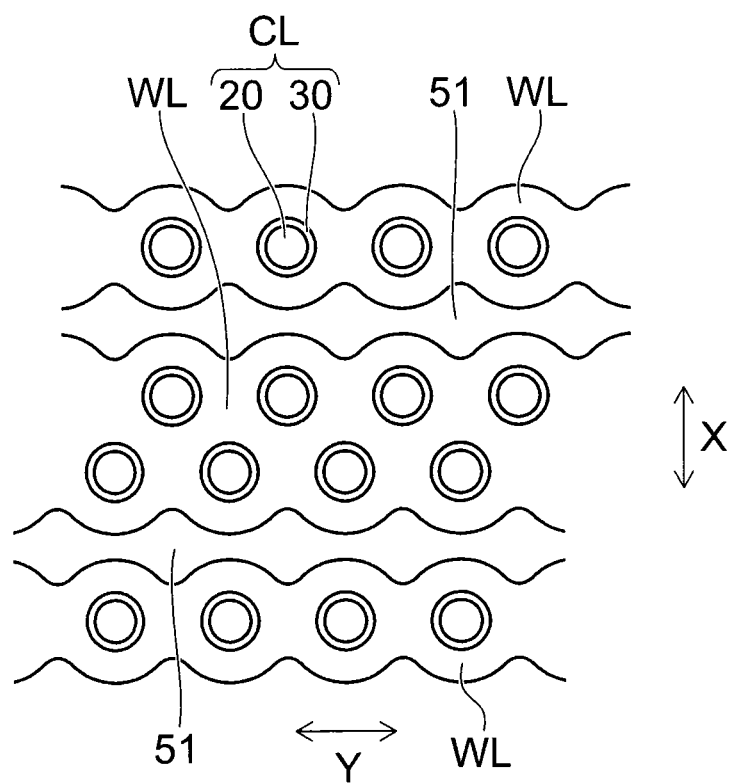
FIG. 25 is a schematic plan view of the semiconductor memory device of the embodiment.

In the layout of FIG. 23A, the multiple pillars CL that are adjacent to each other in the X direction without the slit 51 being interposed may be disposed in a staggered lattice configuration as shown in FIG. 25. The patterning by lithography is easier for the layout of FIG. 25 than for the layout of FIG. 23A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a substrate;
   a stacked body provided on the substrate, the stacked body including a plurality of electrode layers stacked alternately with a plurality of insulating layers;
   an insulating separation film extending in a first direction to divide the stacked body in a second direction intersecting the first direction, the insulating separation film having a side wall having an unevenness repeated along the first direction;
   a channel body provided inside the stacked body to extend in a stacking direction of the stacked body; and
   a memory film provided between the channel body and the electrode layers, the memory film including a charge storage film provided in a cylindrical configuration around the channel body,
   a side wall of the electrode layers contacting the insulating separation film also having an unevenness repeated along the first direction.

2. The device according to claim 1, wherein a pillar of a stacked film of the channel body and the memory film is multiply arranged at different pitches in the first direction and the second direction.

3. The device according to claim 2, wherein
   a column of the plurality of pillars arranged in the first direction has a first pitch, and
   a column of the plurality of pillars arranged in the second direction has a second pitch larger than the first pitch.

4. The device according to claim 3, wherein
   the column of the plurality of pillars arranged in the second direction further has a third pitch smaller than the second pitch, and
   the electrode layers are linked between the adjacent pillars separated from each other by the third pitch.

5. The device according to claim 1, wherein the insulating separation film is a stacked film of the same film as the memory film and the same film as the channel body.

6. The device according to claim 5, wherein
   a portion of the insulating separation film having a relatively large width in the second direction is repeated in the first direction alternately with a portion of the insulating separation film having a relatively small width in the second direction, and
   the portion having the small width in the second direction is plugged with the same film as the memory film.

7. The device according to claim 1, wherein protrusions of the side walls of the electrode layers oppose each other in the second direction with the insulating separation film interposed, and recesses of the side walls of the electrode layers oppose each other in the second direction with the insulating separation film interposed.

8. The device according to claim 1, wherein a protrusion of the side walls of the electrode layers opposes a recess of the side walls of the electrode layers in the second direction with the insulating separation film interposed.

* * * * *